(12) United States Patent
Lee et al.

(10) Patent No.: US 11,616,928 B2
(45) Date of Patent: *Mar. 28, 2023

(54) DISPLAY APPARATUS

(71) Applicant: LG Display Co., Ltd., Seoul (KR)

(72) Inventors: Sungtae Lee, Bucheon-si (KR);
SeYoung Kim, Bucheon-si (KR);
KwanHo Park, Bucheon-si (KR);
YeongRak Choi, Bucheon-si (KR);
Kwangho Kim, Bucheon-si (KR);
Sungsu Ham, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 50 days.

This patent is subject to a terminal disclaimer.

(21) Appl. No.: 17/244,823

(22) Filed: Apr. 29, 2021

(65) Prior Publication Data

US 2021/0250542 A1    Aug. 12, 2021

Related U.S. Application Data

(63) Continuation of application No. 16/941,184, filed on Jul. 28, 2020, now Pat. No. 11,032,509, which is a
(Continued)

(30) Foreign Application Priority Data

Jul. 28, 2017 (KR) ................. 10-2017-0096536

(51) Int. Cl.
*H04N 5/64* (2006.01)
*H04R 1/02* (2006.01)
(Continued)

(52) U.S. Cl.
CPC ......... *H04N 5/642* (2013.01); *H01L 27/3225* (2013.01); *H01L 51/00* (2013.01);
(Continued)

(58) Field of Classification Search
CPC . H04N 5/642; H04R 5/02; H04R 1/26; H04R 1/04; H04R 1/028; H04R 1/025
(Continued)

(56) References Cited

U.S. PATENT DOCUMENTS 7,798,284 B2    9/2010   Wada
2001/0026625 A1  10/2001  Azima et al.
(Continued)

FOREIGN PATENT DOCUMENTS

CN          1344064 A     4/2002
CN          1581891 A     2/2005
(Continued)

OTHER PUBLICATIONS

First Notification of Office Action dated Jun. 24, 2020, issued in corresponding Chinese Patent Application No. 201810832486.3.
(Continued)

*Primary Examiner* — Thjuan K Addy
(74) *Attorney, Agent, or Firm* — Morgan, Lewis & Bockius LLP

(57) ABSTRACT

A display apparatus includes: a display panel including: a display area configured to display an image, and a non-display area, at least one first sound generator in the display area, and at least one second sound generator in the non-display area, wherein each of the at least one first sound generator and the at least one second sound generator is configured to vibrate the display panel to generate sound toward a front of the display panel.

37 Claims, 21 Drawing Sheets

Related U.S. Application Data continuation of application No. 16/042,043, filed on Jul. 23, 2018, now Pat. No. 10,771,730.

(51) Int. Cl.
| | |
|---|---|
| *H04R 5/02* | (2006.01) |
| *H04R 1/26* | (2006.01) |
| *H01L 51/00* | (2006.01) |
| *H01L 27/32* | (2006.01) |
| *G02F 1/1362* | (2006.01) |
| *G02F 1/1333* | (2006.01) |

(52) U.S. Cl.
CPC ............... *H04R 1/025* (2013.01); *H04R 1/26* (2013.01); *H04R 5/02* (2013.01); *G02F 1/1362* (2013.01); *G02F 1/133394* (2021.01); *H04R 2499/15* (2013.01)

(58) Field of Classification Search
USPC .................. 381/333, 332, 388, 178, 173
See application file for complete search history.

(56) References Cited

U.S. PATENT DOCUMENTS

| | | |
|---|---|---|
| 2002/0043653 A1 | 4/2002 | Ogiso |
| 2005/0025330 A1 | 2/2005 | Saiki et al. |
| 2006/0051075 A1 | 3/2006 | Wada |
| 2007/0132911 A1 | 6/2007 | Fujiwara et al. |
| 2009/0097692 A1 | 4/2009 | Sakamoto |
| 2012/0242592 A1 | 9/2012 | Rothkopf et al. |
| 2012/0243719 A1 | 9/2012 | Franklin et al. |
| 2014/0104216 A1 | 4/2014 | Adachi et al. |
| 2014/0153213 A1 | 6/2014 | Oh |
| 2014/0160040 A1 | 6/2014 | Kang et al. |
| 2015/0003641 A1 | 1/2015 | Nakamura |
| 2015/0086046 A1 | 3/2015 | Oh et al. |
| 2015/0160530 A1 | 6/2015 | Han et al. |
| 2015/0341714 A1 | 11/2015 | Ahn et al. |
| 2016/0055801 A1 | 2/2016 | Kim |
| 2017/0127166 A1 | 5/2017 | Noma |
| 2017/0280234 A1 | 9/2017 | Choi et al. |
| 2017/0289694 A1* | 10/2017 | Choi ...................... H04R 7/045 |
| 2017/0330502 A1* | 11/2017 | Jang ..................... G09G 3/3225 |

FOREIGN PATENT DOCUMENTS

| | | |
|---|---|---|
| CN | 1980485 A | 6/2007 |
| CN | 101137251 A | 3/2008 |
| CN | 103220610 A | 7/2013 |
| CN | 103765922 A | 4/2014 |
| CN | 103869523 A | 6/2014 |
| CN | 105096778 A | 11/2015 |
| CN | 105916082 A | 8/2016 |
| CN | 205584480 U | 9/2016 |
| CN | 106406432 A | 2/2017 |
| CN | 106444995 A | 2/2017 |
| EP | 1 881 731 A1 | 1/2008 |
| JP | 2006-140740 A | 6/2006 |
| JP | 2008-268253 A | 11/2008 |
| JP | 6025477 B2 | 11/2016 |
| KR | 10-2006-0051172 A | 5/2006 |
| KR | 101704517 B1 | 2/2017 |
| WO | 00/02417 A1 | 1/2000 |

OTHER PUBLICATIONS

Office Action dated Jan. 26, 2021, issued in corresponding Korean Patent Application No. 10-2017-0096536.

\* cited by examiner

DISPLAY APPARATUS

CROSS-REFERENCE TO RELATED APPLICATION(S)

This application is a continuation of U.S. patent application Ser. No. 16/941,184, filed on Jul. 28, 2020, which is a continuation of U.S. patent application Ser. No. 16/042,043, filed on Jul. 23, 2018, now U.S. Pat. No. 10,771,730, which claims the benefit of and priority to Korean Patent Application No. 10-2017-0096536, filed on Jul. 28, 2017, the entirety of each of which is hereby incorporated by reference.

BACKGROUND

1. Technical Field

The present disclosure relates to a display apparatus, and more particularly, to a display apparatus including a sound generator.

2. Discussion of the Related Art

With the advancement of an information-oriented society, various desires for the display field of expressing information in accordance with an electric information signal are increasing. Thus, research is being conducted on various display apparatuses that are thin, light, and have low power consumption. For example, a display apparatus may be categorized into a liquid crystal display (LCD) apparatus, a field emission display (FED) apparatus, an organic light-emitting display apparatus, etc.

Among the above display apparatuses, the LCD apparatus may include an array substrate including a thin film transistor (TFT), an upper substrate including a color filter and/or a black matrix, and a liquid crystal layer between the array substrate and the upper substrate. An alignment state of the liquid crystal layer is controlled based on an electric field applied to two electrodes of a pixel area. Light transmittance is adjusted based on the alignment state of the liquid crystal layer, thereby displaying an image.

The organic light-emitting display apparatus, which is a self-emitting display apparatus, has a fast response time, high emission efficiency, excellent luminance, and a wide viewing angle in comparison with other display apparatuses. Thus, the organic light-emitting display apparatus is attracting much attention.

Display apparatuses display an image on a display panel, but an additional speaker for supplying a sound has to be provided. If the speaker is provided in a display apparatus, the sound generated in the speaker is projected toward a rear portion of the display panel or a lower portion of the display panel, instead of toward a front portion of the display panel displaying an image. Thus, the sound does not travel in a direction toward a viewer who may be watching an image in front of the display panel, thereby diminishing a viewer's immersion experience.

Moreover, a sound output through a speaker travels to a rear portion of a display panel or a lower portion of the display panel. Thus, the quality of the sound is degraded due to interference with a sound reflected on a wall or a floor. Moreover, if providing a speaker in a set apparatus, such as a television (TV), the speaker occupies a space. Thus, the design and a spatial disposition of the set apparatus are limited.

SUMMARY

Accordingly, the present disclosure is directed to a display apparatus that substantially obviates one or more of the issues due to limitations and disadvantages of the related art.

An aspect of the present disclosure is to provide a display apparatus including a sound generator for enhancing the quality of a sound.

Another aspect of the present disclosure is to provide a display apparatus for enhancing the quality of a sound and a viewer's immersion experience.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel including: a display area configured to display an image, and a non-display area, at least one first sound generator in the display area, and at least one second sound generator in the non-display area, wherein each of the at least one first sound generator and the at least one second sound generator is configured to vibrate the display panel to generate sound toward a front of the display panel.

In another aspect, there is provided a display apparatus, including: a display panel including: a display area configured to display an image, and a non-display area, an optical module on a rear surface of the display panel, at least one coil-type sound generator on a rear surface of the optical module, and at least one piezoelectric-type sound generator in the non-display area.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1A:
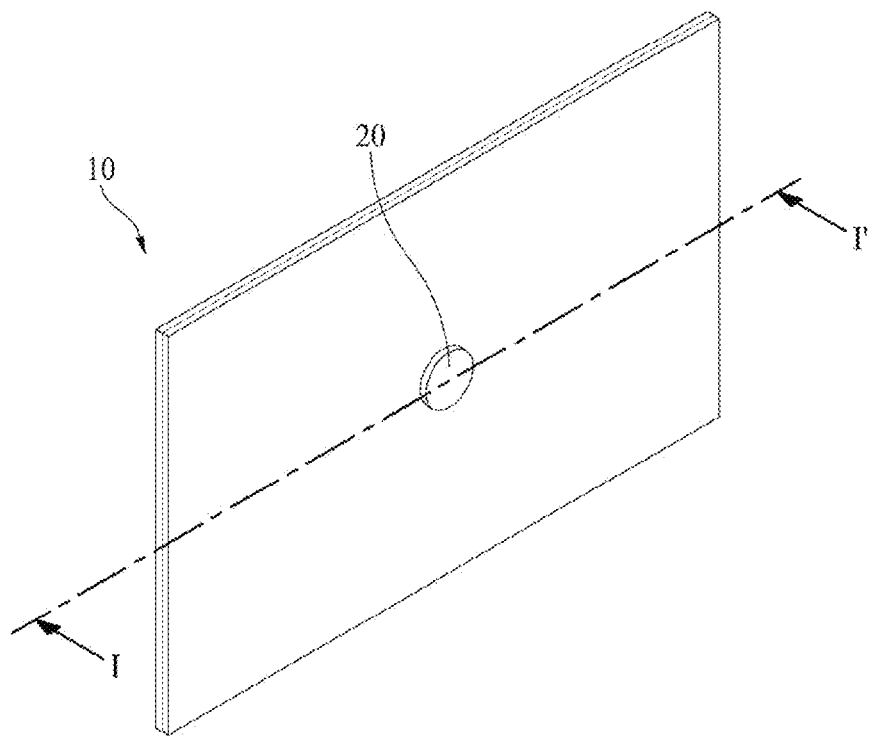
FIGS. 1A and 1B are diagrams illustrating a display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In the present disclosure, examples of a display apparatus is used to encompass a display apparatus such as an organic light-emitting display module (OLED module) or a liquid crystal module (LCM), that may include a display panel and a driving unit for driving the display panel. The display apparatus is used to further encompass a set device (or a set apparatus) or a set electronic apparatus, as a finished product, such as a notebook computer or a laptop computer, a television set, a computer monitor, an equipment apparatus (e.g., display equipment in an automotive apparatus or another type of vehicle apparatus) or a mobile electronic apparatus that is a complete product or a final product (for example, a smartphone or an electronic pad, etc.) that may include the LCM or the OLED module. Therefore, in the present disclosure, the display apparatus is used display apparatus itself, such as the LCM or the OLED module, and also a set apparatus which is a final consumer apparatus or an application product including the LCM or the OLED module.

In some example embodiments, the LCM or the OLED module including a display panel and a driving unit thereof may be referred to as a display apparatus, and the electronic apparatus as a final product including the LCM or the OLED module may be referred to as a set apparatus. For example, the display apparatus may include a display panel, such as an LCD or an OLED, and a source printed circuit board (PCB) as a controller for driving the same, the set apparatus may further include a set PCB that is a set controller set to be electrically connected to the source PCB and to control the overall operations of the set apparatus.

A display panel applied to an embodiment may use all types of display panels, such as a liquid crystal display panel, an organic light-emitting diode (OLED) display panel, and an electroluminescent display panel, but is not limited to these specific types. For example, the display panel of the present disclosure may be any panel capable of being vibrated by a sound generation device according to embodiments of the present disclosure to output a sound. A shape or a size of a display panel applied to a display apparatus according to embodiments of the present disclosure is not limited.

For example, if a display panel is a liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT), which is a switching element for adjusting a light transmittance of each of the plurality of pixels, an upper substrate including a color filter and/or a black matrix, and a liquid crystal layer between the array substrate and the upper substrate.

In addition, if a display panel is an organic light-emitting display panel, the display panel may include a plurality of gate lines, a plurality of data lines, and a plurality of pixels respectively provided in a plurality of pixel areas defined by intersections of the gate lines and the data lines. The display panel may include an array substrate including a TFT, which is an element for selectively applying a voltage to each of the pixels, an organic light-emitting device layer on the array substrate, and an encapsulation substrate disposed on the array substrate to cover the organic light-emitting device layer. The encapsulation substrate may protect the TFT and the organic light-emitting device layer from an external impact, and may prevent water or oxygen from permeating into the organic light-emitting device layer. A layer provided on the array substrate may include an inorganic light-emitting layer (for example, a nano-sized material layer or the like). The display panel may further include a backing such as a metal plate attached to the rear surface of the display panel, but the backing is not limited to the metal plate, and another structure may be included.

In the present disclosure, the display panel including a sound generation device may be implemented at a user interface module in a vehicle, such as the central control panel area in an automobile. For example, such a display panel may be configured between two front seat occupants, such that sounds due to a vibration of the display panel propagate towards the interior of the vehicle. As such, the audio experience within a vehicle can be improved as compared to having speakers at the interior sides or edges of the vehicle.

The inventors have recognized the above-described problems and have conducted various experiments so that when watching an image in front of a display panel, a traveling direction of a sound becomes a direction toward a front portion of the display panel. Thus, sound quality is enhanced. Through the various experiments, the inventors have invented a display apparatus having a new structure, which outputs a sound so that a traveling direction of a sound becomes a direction toward a front portion of a display panel, thereby enhancing sound quality.

Hereinafter, embodiments of the present disclosure will be described in detail with reference to the accompanying drawings.

Research is being done for implementing a sound generator in a display apparatus without a separate speaker being provided in the display apparatus. This will be described below with reference to FIGS. 1 and 2.

Figure 1B:
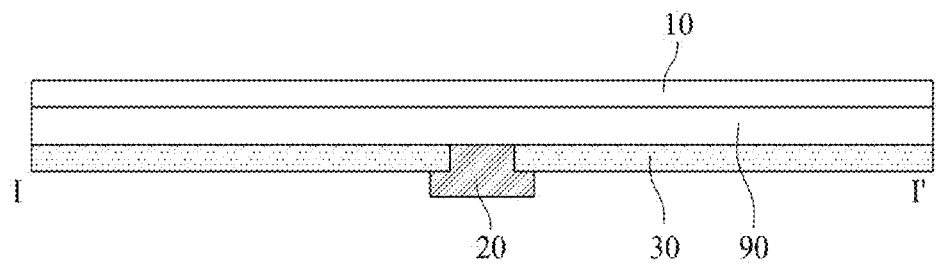

FIGS. 1A and 1B are diagrams illustrating a display apparatus according to an embodiment of the present disclosure.

FIG. 1A is a diagram illustrating a rear surface of the display apparatus. The display apparatus may include a display panel 10, which may display an image, and a sound generator 20, which may vibrate the display panel 10 to generate sound.

If the display panel 10 is a liquid crystal display panel, the display panel 10 may display an image by using light irradiated from a backlight. The inventors have recognized that to realize a sound in the liquid crystal display panel, e.g., the display panel 10, a method of vibrating the liquid crystal display panel to generate sound is a method for reproducing or generating sound. Therefore, the inventors have recognized that disposition of a sound generator is important. Accordingly, the inventors have performed an experiment for providing the sound generator between the display panel 10 and the backlight. In this case, the inventors have recognized that, because the backlight is hidden by the sound generator, an image cannot be displayed on the display panel 10.

Therefore, a method for providing the sound generator on a rear surface of the backlight without the sound generator being disposed adjacent to the display panel 10 has been reviewed. This will be described below with reference to FIG. 1B.

FIG. 1B is a cross-sectional view taken along line I-I' of FIG. 1A. With reference to FIG. 1B, the display apparatus may include a sound generator 20, a backlight 90, and a supporting member 30. The sound generator 20 may be on a rear surface of the backlight 90, and may be configured as a coil-type sound generator 20 for generating a sound with a current applied to a coil. The inventors have recognized a problem in which a high-pitched sound is not reproduced or generated due to a plurality of layers configuring the backlight 90 between the display panel 10 and the sound generator 20. This will be described below with reference to FIG. 2.

Figure 2:
FIG. 2 is a diagram showing a sound output characteristic according to an embodiment of the present disclosure.

FIG. 2 is a diagram showing a sound output characteristic according to an embodiment of the present disclosure.

FIG. 2 illustrates a sound output characteristic of the display apparatus of FIG. 1. In FIG. 2, the abscissa axis (x-axis) represents a frequency in hertz (Hz), and the ordinate axis (y-axis) represents a sound pressure level in decibels (dB). With reference to FIG. 2, it can be seen that a sound pressure level is reduced in a frequency domain of about 3 kHz or more, which is a frequency domain of a high-pitched sound band.

Therefore, the inventors have performed an experiment for generating sound having the high-pitched sound band. The inventors have recognized that even when a sound generator is additionally provided on a rear surface of a backlight, a high-pitched sound cannot be generated. Therefore, by performing several experiments, the inventors have recognized that piezoceramics may be applied for reproducing or generating a high-pitched sound. The piezoceramics have a fast response time of several milliseconds (msec). Thus, piezoceramics have an advantage in which a frequency range enabling a vibration is broad.

Therefore, the inventors have performed several experiments on a case in which the piezoceramics corresponding to the sound generator is provided in a display apparatus. Even when the piezoceramics corresponding to the sound generator are disposed between a display panel and the backlight, the inventors have recognized that a high-pitched sound is not generated due to a plurality of layers configuring the backlight. Also, the inventors have recognized that the sound generator for vibrating the display panel to generate a high-pitched sound should be installed in the display panel. Therefore, the inventors have performed an experiment on a case in which the sound generator is not disposed inside the display panel, but is disposed in a region other than inside the display panel. Through the experiment, the inventors have recognized that a sound difference occurs between a case in which the sound generator is in the display panel and a case in which the sound generator is in an outer portion of the display panel. Therefore, the inventors have recognized that, to generate a high-pitched sound, the sound generator should be disposed in the outer portion of the display panel, instead of a region inside the display panel. Moreover, the sound generator should be disposed in a region in which a plurality of layers are not provided. Accordingly, the inventors have invented a new structure of a display apparatus, including a sound generator, which may generate sound and may be disposed in a region that does not affect an image displayed by the display panel.

FIGS. 3A to 3F are diagrams illustrating a display apparatus according to an embodiment of the present disclosure.

Figure 3A:
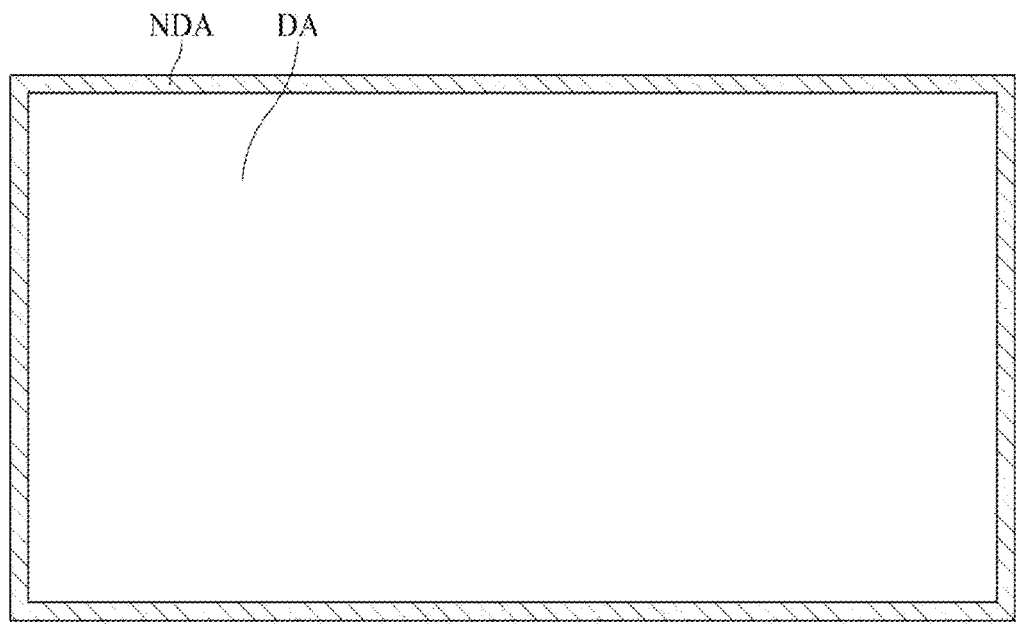
FIGS. 3A to 3F are diagrams illustrating a display apparatus according to an embodiment of the present disclosure.
Figure 3B:
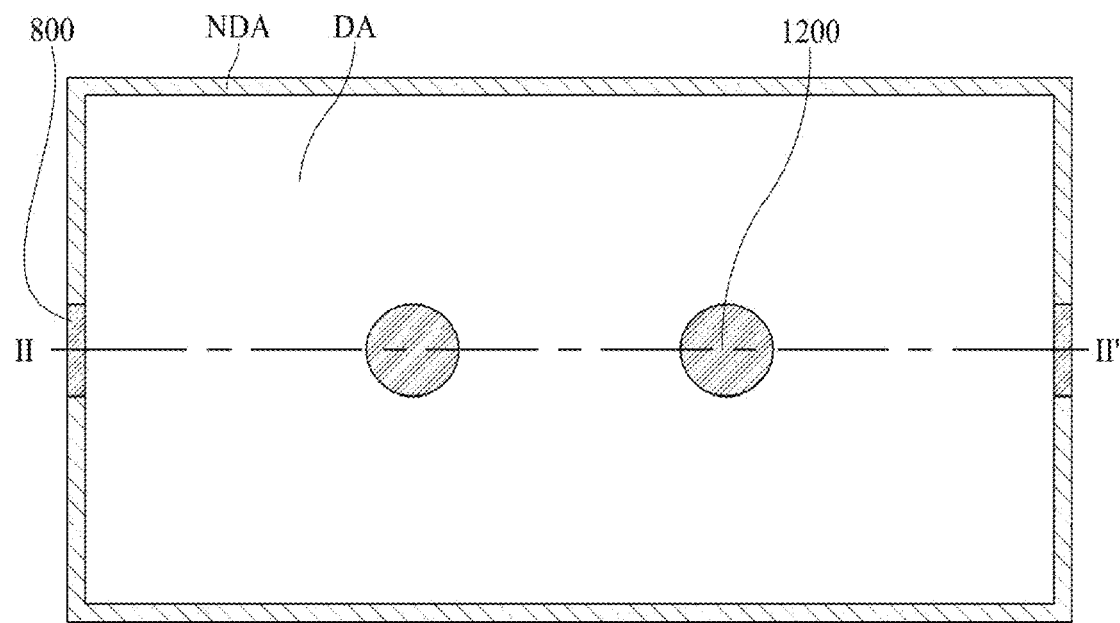

FIG. 3A is a front view of the display apparatus. FIG. 3B is a back view of the display apparatus. With reference to FIGS. 3A and 3B, the display apparatus may include a display panel 100 that may display an image. The display panel 100 may include a non-display area NDA and a display area DA. The non-display area NDA may be an area that may not display an image, and may be referred to as a "bezel area." The display area DA may be an area that may display an image. Generally, the surface from which the display panel 100 displays an image may be referred to as "front surface" of the display panel 100.

The display panel 100 may include a first substrate, a second substrate, and a liquid crystal layer. The first substrate may include a pixel electrode or a common electrode for controlling alignment of liquid crystal molecules of the liquid crystal layer, and may include a thin film transistor (TFT) connected to the pixel electrode. The second substrate may include the color filter layer for realizing one or more colors.

The display panel 100 may drive the liquid crystal layer with an electric field generated from a data voltage and a common voltage, which may be applied to each of a plurality of pixels, thereby controlling a light transmittance of the liquid crystal layer to display an image. The liquid crystal layer may be driven in various driving modes, such as a twisted nematic (TN) mode, a vertical alignment (VA) mode, an in-plane switching (IPS) mode, and a fringe field switching (FFS) mode.

For example, the first substrate may be a TFT substrate, and may include the plurality of pixels defined by a plurality of gate lines and a plurality of data lines that intersect one another. Each of the pixels may include a TFT connected to a corresponding gate line and a corresponding data line, a pixel electrode connected to the TFT, and a common electrode adjacent to the pixel electrode. The common electrode may be supplied with the common voltage. The common electrode may be provided on the second substrate, based on a driving mode of the liquid crystal layer. The driving circuit unit for driving the display panel 10 and the pad part connected to the driving circuit unit may be on one side of the first substrate. The second substrate may be a color filter array substrate, and may include the color filter layer. When the display panel 100 is driven in a color filter on TFT (COT) mode or a TFT on color filter (TOC) mode, the color filter layer may be provided on the first substrate.

An optical module may be under the display panel 100, and may irradiate light onto the display panel 100. The display panel 100 may control a transmittance of the light emitted from the optical module of the display panel 100 to display an image.

The display apparatus may be a display module that may include the display panel 100 and the driving circuit unit for driving the display panel 100. For example, the driving circuit unit may include an integrated circuit (IC) chip and a flexible printed circuit board (FPCB). The driving circuit unit, such as a driving IC for applying a voltage, may be mounted on the FPCB. Alternatively, the driving circuit unit may be implemented as another type, such as a chip-on-film (COF) type.

The gate lines and the data lines of the display panel 100 may be connected to the FPCB. When an electrical signal is applied from the FPCB, the electrical signal may be applied to a source electrode and a drain electrode of the TFT. The FPCB may receive an image signal from the outside of the display panel 100 to apply a driving signal to the gate lines and the data lines of the display panel 100.

The FPCB may generate a gate signal and a data signal for driving the display panel 100 and a plurality of timing signals that may allow the gate signal and the data signal to be applied at an appropriate time. The FPCB may apply the gate signal and the data signal to the gate lines and the data lines of the display panel 100. The FPCB may include an amplifier.

A polarization member may be on an upper surface of each of the first and second substrates. A cover window may be on the display module. The cover window may be attached to a whole surface of the display module or a whole surface of the polarization member.

As described above with reference to FIGS. 1 and 2, a sound generator may be in the non-display area NDA to generate a high-pitched sound. The non-display area NDA may be a bezel area, and a display apparatus, in which a size of a display area for displaying an image is enlarged by narrowing a bezel area, is being developed. For example, the non-display area NDA may be a very narrow area, which may have a width of about 5 mm or less and a thickness of about 1.8 mm or less. A width and a thickness may vary based on a design of the display apparatus, but are not limited thereto.

If a coil-type sound generator is in the non-display area, the coil-type sound generator may have a width of about 20 mm. Thus, a spatial limitation may occur in the non-display area in disposing the coil-type sound generator. Also, if the coil-type sound generator is in the non-display area, a thickness of the non-display area may increase. Thus, the bezel area may be enlarged, causing a problem in which a thickness of the display apparatus may increase.

Therefore, the inventors have performed several experiments on a sound generator in a non-display area without any increase in a bezel area, and which may generate a high-pitched sound. Through the several experiments, the inventors have recognized that a piezoelectric sound generator may be disposed in the non-display area to generate a high-pitched sound. Because the non-display area is an area in which a plurality of layers is not provided, the inventors have recognized that a difficulty of high-pitched sound generation caused by the plurality of layers is solved. This will be described below.

With reference to FIG. 3B, at least one first sound generator 1200, which may be a coil-type sound generator, may be provided in the display area DA, and at least one second sound generator 800, which may be a piezoelectric-type sound generator, may be provided in the non-display area NDA. The at least one first sound generator 1200 may be provided as two, but the number of the first sound generators 1200 is not limited thereto.

To generate a high-pitched sound, the at least one second sound generator 800 may be disposed in the non-display area NDA outside the display panel without affecting an image displayed by the display panel. The at least one second sound generator 800 may be manufactured to be thin. Thus, the at least one second sound generator 800 may be disposed without any increase in a width of the non-display area NDA.

Moreover, the second sound generator 800 may generate sound by using the non-display area NDA or the bezel area as a vibration plate. Accordingly, a degree of freedom in disposition of the second sound generator 800 may be enhanced, regardless of a position at which the second sound generator 800 is disposed in the non-display area NDA. When the second sound generator 800 is not in the display area DA in which the optical module and the like may be disposed, a sound path may not be blocked by the optical module, and the like. Thus, sound quality may be enhanced. A thickness of the second sound generator 800 may be thin. Thus, a small speaker may be provided in the display apparatus.

The non-display area NDA may include four peripheries or four sides surrounding the display area DA. For example, the at least one piezoelectric-type sound generator 800 may be in at least one of the four peripheries or at least one of the four sides in the non-display area NDA. The first sound generator 1200 may be in the display area DA, and the second sound generator 800 may be at a position corresponding to the first sound generator 1200. The first sound generator 1200 and the second sound generator 800 may be asymmetrically disposed. For example, the first sound generator 1200 may be in a center of the display area DA, and the second sound generator 800 may be, instead of in a center, in one of the four peripheries or one of the four sides in the non-display area NDA. This will be described below with reference to FIGS. 3C to 3F.

Figure 3C:
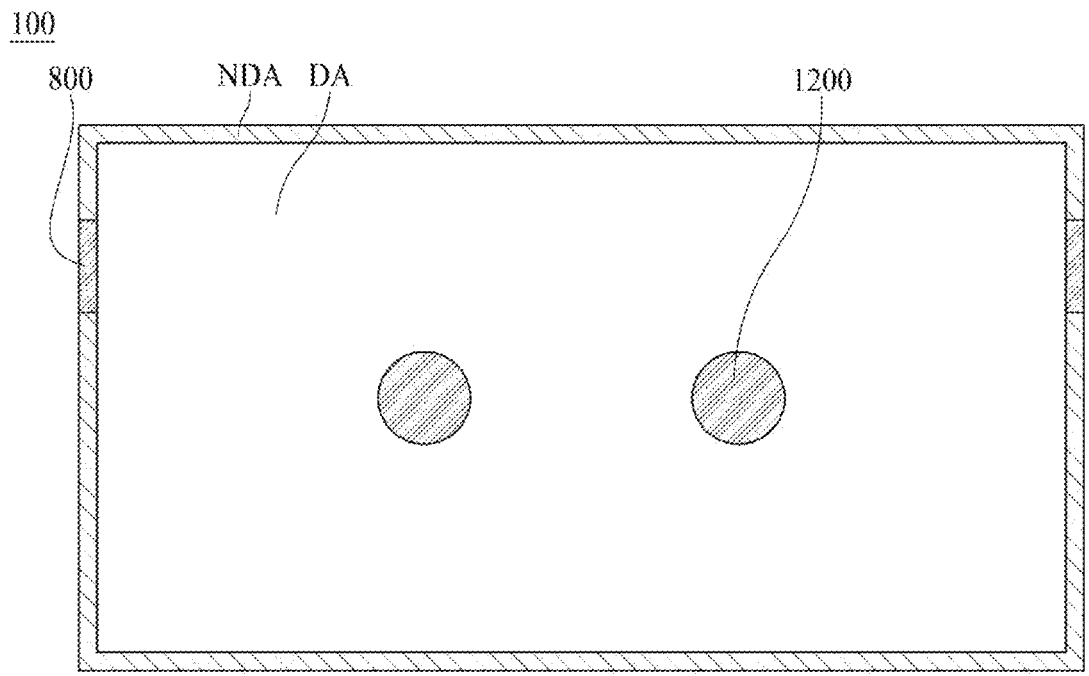

With reference to FIG. 3C, the at least one second sound generator 800 may be in an upper portion of the non-display area NDA. For example, the at least one first sound generator 1200 and the at least one second sound generator 800 may be asymmetrically disposed. If the at least one second sound generator 800 is in one periphery of the non-display area NDA, a high-pitched sound may be further enhanced.

Figure 3D:
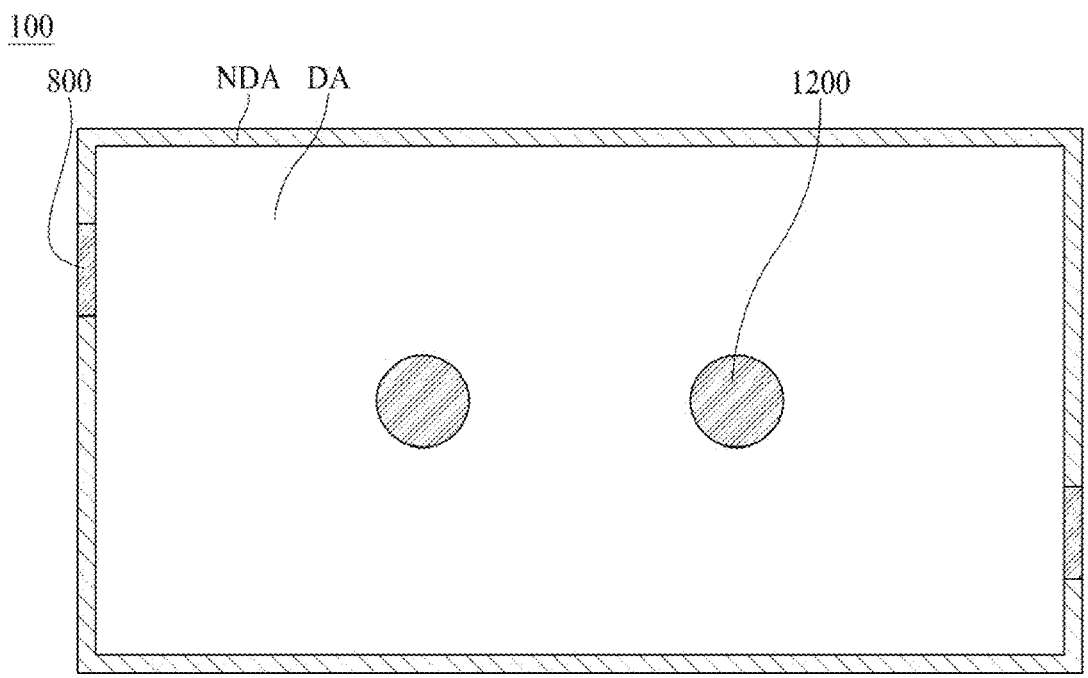
Figure 3E:
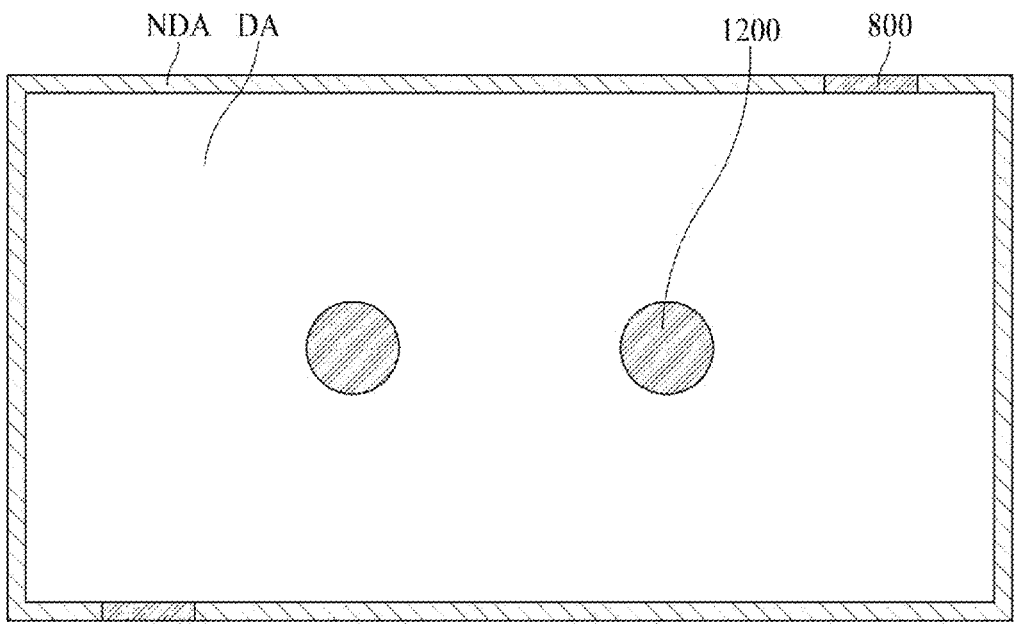

With reference to FIG. 3D, the at least one second sound generator 800 may not be at the same position of the non-display area NDA, for example, a plurality of second sound generators 800 may not be disposed at the same positions of peripheries of the non-display area NDA, but may be at different positions of the peripheries of the non-display area NDA. With reference to FIG. 3E, the at least one second sound generator 800 may be respectively in an upper portion and a lower portion of the non-display area NDA.

Figure 3F:
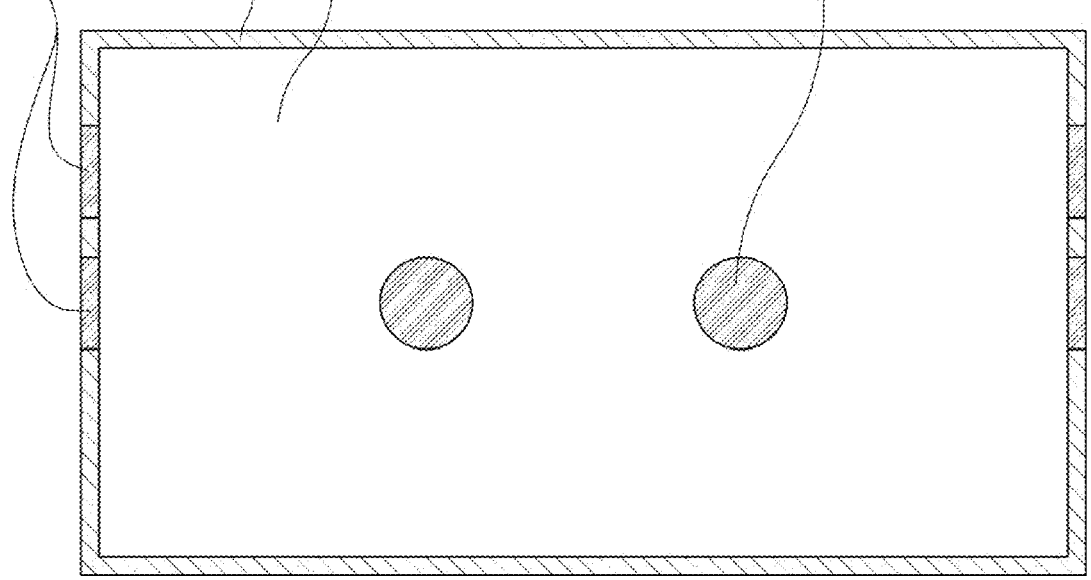

With reference to FIG. 3F, the at least one second sound generator 800 may be configured as a second sound generator array in which one or more second sound generators 800 are provided. The second sound generator array may be configured with two or more second sound generators 800. Therefore, if the second sound generator 800 cannot output a sufficient sound pressure level, a higher sound pressure level may be output. In the example of FIG. 3F, two sound generator arrays are illustrated, but embodiments are not limited thereto. For example, three or more sound generator arrays may be provided.

In FIGS. 3B to 3F, the second sound generator 800 may be configured in a straight shape, but embodiments are not limited thereto. For example, if the second sound generator 800 is in a periphery of the non-display area NDA, the second sound generator 800 may be disposed along or corresponding to a shape of the periphery. For example, the second sound generator 800 may be disposed in a "¬"-shape or a "⌊"-shape, e.g., various orientations of "L"-shapes.

Therefore, each of the first sound generator 1200 and the second sound generator 800 may vibrate the display panel 100 to output sound in a forward direction of the display panel 100, thereby enhancing the viewer's immersion experience. When the second sound generators 800 are in the non-display area NDA, a distance between the second sound generators 800 in the non-display area NDA increases, thereby enhancing a stereo effect of sound. Moreover, the at least one first sound generator 1200, which may be a coil-type sound generator, and the at least one second sound generator 800, which may be a piezoelectric-type sound generator, may each be referred to as an actuator, an exciter, or a transducer.

Figure 4:
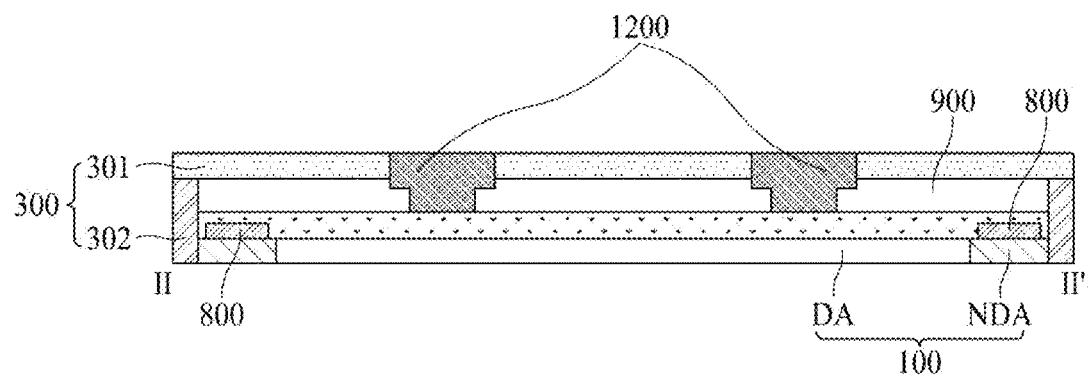
FIG. 4 is a cross-sectional view taken along line II-IF of FIG. 3B.

FIG. 4 is a cross-sectional view taken along line II-IF of FIG. 3B.

With reference to FIG. 4, at least one first sound generator 1200, which may be a coil-type sound generator, may be in a display area DA, and may be between a supporting member 300 and an optical module 900. At least one second sound generator 800, which may be a piezoelectric-type sound generator, may be in a non-display area NDA.

The supporting member 300 may support one or more of a rear surface and a side surface of a display panel 100. The supporting member 300 may include a rear cover 301 that supports the rear surface of the display panel 100 and a side supporting member 302 that supports the side surface of the display panel 100. The rear cover 301 may be a back cover, and the side supporting member 320 may be a middle cabinet. However, the embodiments are not limited to the terms. Moreover, the supporting member 300 may be a plate member provided on the rear surface or a whole surface of the display panel 100. In general, the rear surface of the display panel 100 may be defined as the surface opposite to the surface at which the display panel 100 displays an image, which may be defined as the front surface of the display panel 100.

The supporting member 300 may be referred to as a cover bottom, a plate bottom, a back cover, a base frame, a metal frame, a metal chassis, a chassis base, or an m-chassis. Therefore, the supporting member 300 may include all types of frames or a plate structure disposed on the rear surface of the display apparatus.

The coil-type sound generator of FIG. 4 will be described below with reference to the examples of FIGS. 5 to 7.

Figure 5:
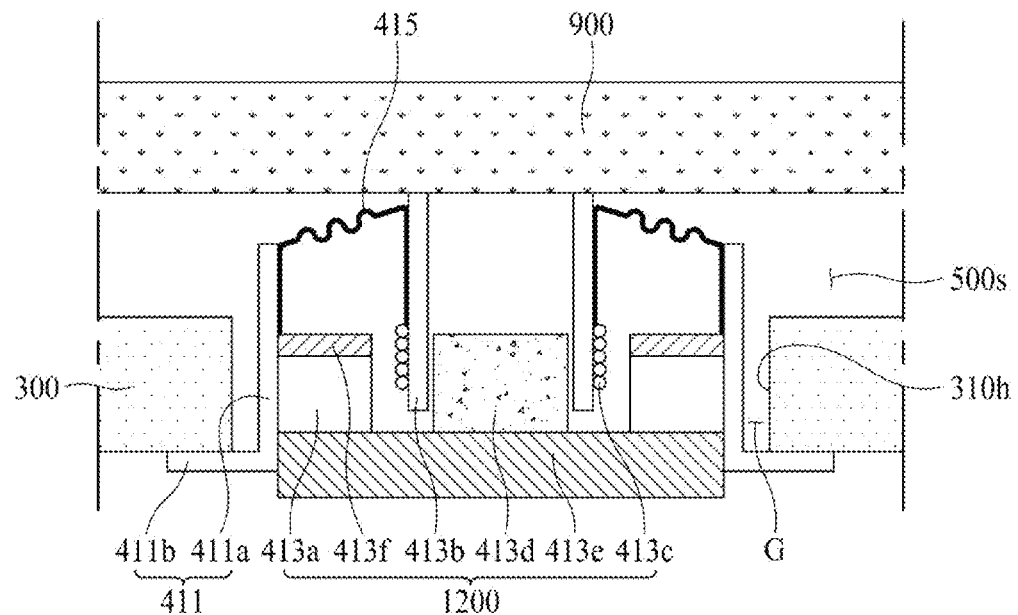
FIG. 5 is a diagram illustrating a sound generator according to an embodiment of the present disclosure.

FIG. 5 is a diagram illustrating a sound generator according to an embodiment of the present disclosure.

With reference to FIG. 5, the sound generator according to an embodiment of the present disclosure may include at least one first sound generator 1200, which may be a coil-type sound generator. The first sound generator 1200 may be fixed to a supporting member 300, and may vibrate a display panel 100 by using an optical module 900.

The at least one first sound generator 1200, e.g., the coil-type sound generator, may vibrate the optical module 900 with a current applied thereto, based on Fleming's Left-Hand Rule for Motors, and may be referred to as a "vibration generation" module or a "sound generation" module. The at least one first sound generator 1200, e.g., the coil-type sound generator, may be on a rear surface of the optical module 900. Generally, the rear surface of the optical module 900 may be defined as the surface of the optical module 900 opposite to the front surface of the display panel 100. For example, the at least one first sound generator 1200 may be at a center of the rear surface of the optical module 900 or at a center of a screen of the display panel 100. The at least one first sound generator 1200, e.g., the coil-type sound generator, may be in a first region and a second region of the rear surface of the optical module 900. The at least one first sound generator 1200, e.g., the coil-type sound generator, may be in a first region and a second region of the display panel 100. The first region may be a left region of the optical module 900 or the display panel 100, and the second region may be a right region of the optical module 900 or the display panel 100. Also, the first region may be a left region of the optical module 900 or a display area, and the second region may be a right region of the optical module 900 or the display area. It should be appreciated that "left" and "right" as used herein are interchangeable, as would be understood to one of ordinary skill in the art. The terms are used herein for convenience of explanation.

The supporting member 300 may be on a rear surface of the display panel 100. A module frame 411 may support the at least one first sound generator 1200, e.g., the coil-type sound generator. The module frame 411 may be accommodated or inserted into a supporting hole 310h in the supporting member 300, and may be fixed to the supporting member 300. For example, the module frame 411 may include a frame body 411a and a supporting bracket 411b.

A portion of an upper portion of the frame body 411a may be accommodated or inserted into the supporting hole 310h in the supporting member 300 with respect to a thickness direction of the display panel 100. Thus, the frame body 411a may be in a space 500s between the optical module 900 and the supporting member 300. A gap G may be between the frame body 411a and the supporting hole 310h of the supporting member 300. The gap G may act as a vent for enabling air to smoothly circulate when the optical module 900 is vibrating. Also, the gap G may act as a path through which, in addition to a sound pressure based on a vibration of the optical module 900, noise occurring, when the at least one first sound generator 1200 (e.g., the coil-type sound generator) is driven, is emitted to the outside. The supporting bracket 411b may be installed on each of one side and the other side, which may be parallel with each other, of the frame body 411a, and may be fixed to a rear surface of the supporting member 300.

The at least one first sound generator 1200, e.g., the coil-type sound generator, may be in the module frame 411 to vibrate the optical module 900. For example, the at least one coil-type sound generator 1200 may include a magnet 413a, a bobbin 413b near a center pole 413d, and a coil 413c around the bobbin 413b. The at least one first sound generator 1200, e.g., the coil-type sound generator, may be referred to as a "dynamic" type or an "external magnetic" type, in which the magnet 413a is outside the coil 413c.

The magnet 413a may be a permanent magnet. For example, a sintering magnet, which may include a material such as barium ferrite, may be used as the magnet 413a. A material of the magnet 413a may include one or more of: ferric oxide ($Fe_2O_3$), barium carbonate (or witherite) ($BaCO_3$), a neodymium (Nd) magnet, strontium ferrite ($Fe_{12}O_{19}Sr$), e.g., with an improved magnet component, an alloy cast magnet including aluminum (Al), nickel (Ni), and cobalt (Co), and the like. As another example, the neodymium magnet may be neodymium-iron-boron (Nd—Fe—B). However, embodiments are not limited these examples. The magnet 413a may have a ring shape, although embodiments are not limited thereto.

The bobbin 413b may be accommodated or inserted into the magnet 413a. For example, the bobbin 413b may be accommodated or inserted into the magnet 413a. Thus, an outer circumference surface of the bobbin 413b may be surrounded by the magnet 413a. For example, the bobbin 413b may be a structure including a material produced by processing pulp or paper, aluminum (Al), magnesium (Mg), an alloy of Al and Mg, synthetic resin such as polypropylene, or a polyamide-based fiber. Embodiments are not limited to these examples.

The bobbin 413b may be provided in a circular shape or an oval shape, although embodiments are not limited to these example shapes. An oval shape may include an elliptical shape, an egg-shape, a rectangular shape with rounded corners, or other non-circular curved shape having a width different than its height. If the bobbin 413b is provided in an elliptical shape or an oval shape, a sound having a high-pitched sound band may be more improved than for a circular shape, and the occurrence of heat caused by a vibration of the bobbin 413b may be reduced, thereby enhancing a heat dissipation characteristic.

The coil 413c may be wound to surround a lower outer circumference surface of the bobbin 413b, and may be supplied with a current for sound generation from the outside. The coil 413c may be raised and lowered along with the bobbin 413b. For example, the coil 413c may be referred to as a voice coil. When the current is applied to the coil 413c, a whole portion of the bobbin 413b may be guided and moved by the center pole 413d according to Fleming's Left Hand Rule for Motors based on an application magnetic field generated around the coil 413c and an external magnetic field generated around the magnet 413a.

A front surface (or an end) of the bobbin 413b may contact a rear surface of the optical module 900. Thus, the bobbin 413b may vibrate the rear surface of the optical module 900 according to whether a current is applied thereto or not, and a sound wave may be generated based on a vibration of the display panel 100 performed based on the vibration of the optical module 900.

The bobbin 413b may include a buffer pad. The buffer pad may be on a front surface of the bobbin 413b, and may transfer an elevation (or a vibration) of the bobbin 413b to the rear surface of the optical module 900. For example, the buffer pad may be a plate member having a ring shape, which may be attached to the front surface of the bobbin 413b, or may be a disc member, e.g., covering the front surface of the bobbin 413b.

The center pole 413d may be accommodated or inserted into the bobbin 413b, and may guide an elevation of the bobbin 413b. For example, the center pole 413d may be accommodated or inserted into the bobbin 413b, e.g., having a cylindrical shape. Thus, an outer circumference surface of the center pole 413d may be surrounded by the bobbin 413b. For example, the center pole 413d may be referred to as an "elevation guider" or "pole pieces."

The coil-type sound generator 1200 may further include a first plate 413e and a second plate 413f. The first plate 413e may be accommodated or inserted into and fixed to a hollow part in the module frame 411, and may support each of a rear surface of the magnet 413a and a rear surface of the center pole 413d. The second plate 413f may be connected to a front surface of the magnet 413a.

The first plate 413e and the second plate 413f may each include a material having magnetic properties, such as iron (Fe). Iron enables a magnet component to be well-transferred to the magnet 413a. The first plate 413e and the second plate 413f are not limited to the terms, for example, each may be referred to as a "yoke."

The center pole 413d and the first plate 413e may be provided as one body. For example, the center pole 413d may vertically protrude from a front surface of the first plate 413e, e.g., to have a shape capable of being inserted into the bobbin 413b, and may be accommodated or inserted into the bobbin 413b.

A damper 415 may be between the module frame 411 and the coil-type sound generator 1200. For example, the damper 415 may be between a body protrusion of the frame body 411a configuring the module frame 411 and the bobbin 413b configuring the coil-type sound generator 1200. The damper 415 may be referred to as a spider, a suspension, or an edge.

One end of the damper 415 may be connected to an inner sidewall of the body protrusion of the frame body 411a, and the other end of the damper 415 may be connected to an upper outer sidewall of the bobbin 413b. The damper 415 may be provided in a structure that may be wrinkled between the one end and the other end thereof, and may be contracted and relaxed based on a vertical motion of the bobbin 413b to control a vibration of the bobbin 413b. Therefore, the damper 415 may be connected between the module frame 411 and the bobbin 413b, and may limit a vibration distance of the bobbin 413b by using a restoring force. For example, when the bobbin 413b moves by a particular distance or more or vibrates by a particular distance or less, the bobbin 413b may be restored to its original position with the restoring force of the damper 415.

The first sound generator 1200 according to an embodiment of the present disclosure, e.g., the coil-type sound generator, may include two or more sound generators or a pair of sound generators, which may be spaced apart from each other and disposed in parallel. The two or more sound generators or the pair of sound generators may each include the module frame 411 and the damper 415.

Figure 6:
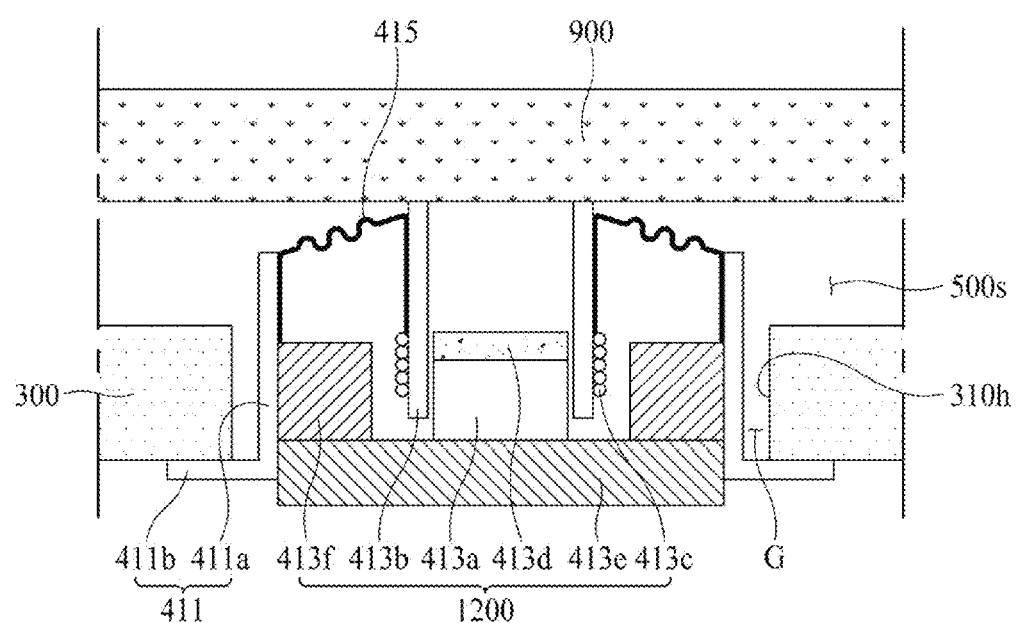
FIG. 6 is a diagram illustrating a sound generator according to another embodiment of the present disclosure.

FIG. 6 is a diagram illustrating a sound generator according to another embodiment of the present disclosure.

With reference to FIG. 6, a first sound generator 1200, e.g., a coil-type sound generator, is illustrated as an internal magnet type in which a magnet 413a is inside a coil 413c. The sound generator illustrated in the example of FIG. 6 is similar to the sound generator described above with reference to the example of FIG. 5. Thus, duplicate description is omitted or will be briefly given.

The first sound generator 1200 may include a magnet 413a in a center of a first plate 413e, a center pole 413d connected to a front surface of the magnet 413a, a bobbin 413b surrounding an outer surface of the magnet 413a and an outer surface of the center pole 413d, a coil 413c wound to surround a lower outer circumference surface of the bobbin 413b, and a second plate 413f protruding in a periphery of a front surface of the first plate 413e and surrounding the coil 413c. The first plate 413e and the second plate 413f may be provided as one body, e.g., having a U-shape. The first plate 413e and the second plate 413f are not limited to these terms, for example, the first plate 413e and the second plate 413f may each be referred to as a "yoke." The first sound generator 1200 of the internal magnet type has a relatively small magnet flux leakage, and has a relatively small overall size.

The display apparatus according to the present disclosure may include a sound generator 1200 having the external magnet type or the internal magnet type. In the following description, the sound generator 1200 having the internal magnet type will be described as an example.

The sound generator 1200 of the display apparatus according to an embodiment of the present disclosure is not limited to the structures illustrated in the examples of FIGS. 5 and 6, and may include another kind of sound generator, for example, in which a front and a rear vibrates the display panel 100 with a current applied thereto to generate sound.

Figure 7A:
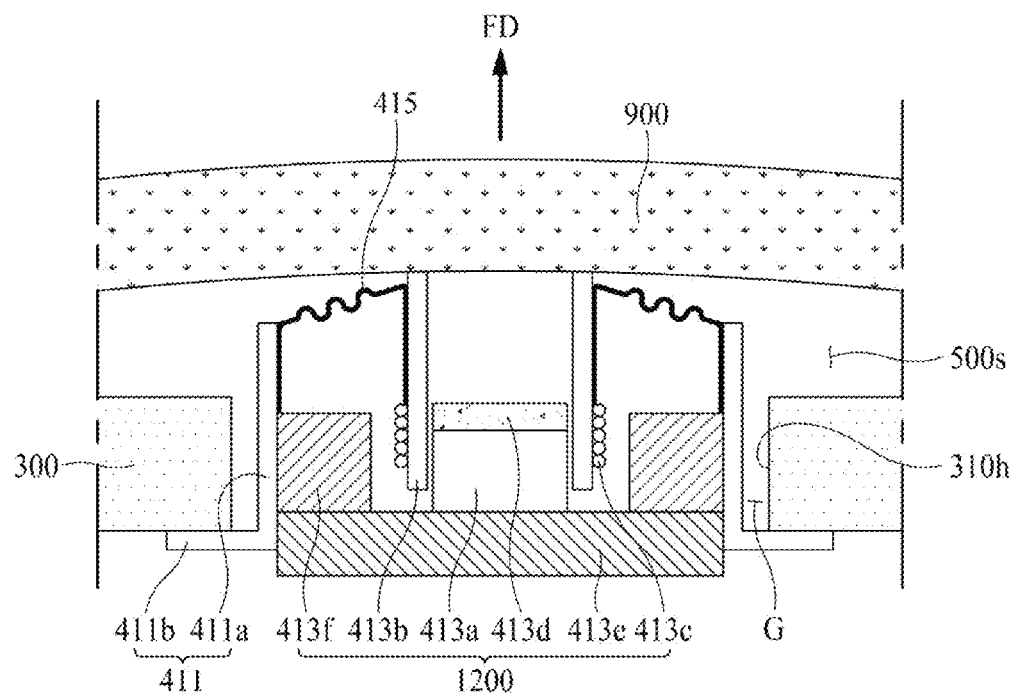
FIGS. 7A and 7B are diagrams for describing a sound generation method of a display apparatus according to an embodiment of the present disclosure.
Figure 7B:
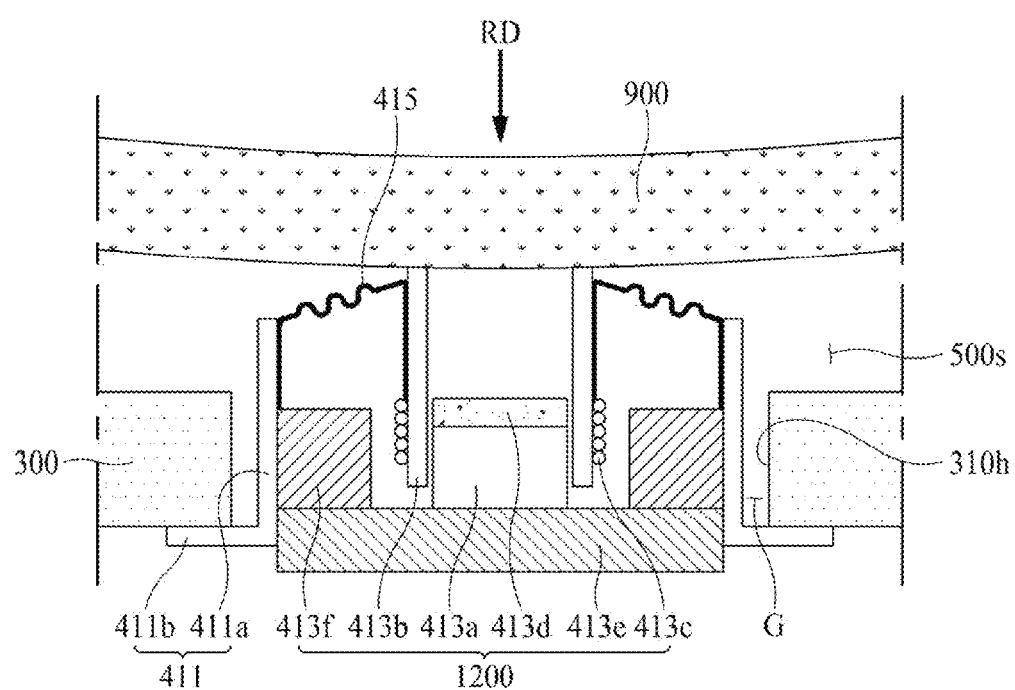

FIGS. 7A and 7B are diagrams for describing a sound generation method of a display apparatus according to an embodiment of the present disclosure.

In a first sound generator 1200 according to an embodiment of the present disclosure, a center pole 413d, e.g., on a first plate 413e supporting a magnet 413a, may be a north pole (N-pole), a second plate 413f connected to a front surface of the first plate 413e may be a south pole (S-pole), and an external magnetic field may be generated between the center pole 413d and the second plate 413f. In this state, when a sound generation current is applied to a coil 413c, an application magnetic field may be generated around the coil 413c. Thus, as illustrated in FIG. 7A by an arrow, a force for moving a bobbin 413b in a forward direction FD of a display panel 100 may be generated based on the application magnetic field and the external magnetic field. Therefore, as the bobbin 413b moves in the forward direction FD of the display panel 100, an optical module 900 contacting the bobbin 413b may vibrate in the forward direction FD, thereby vibrating the display panel 100. A sound wave generated by the vibration of the display panel 100 may be output to the forward direction FD of the display panel 100. The forward direction FD of the display panel 100 may be the direction in which the display panel 100 displays an image.

In a state in which the bobbin 413b has moved in the forward direction FD, when a current applied to the coil 413c is cut off or a current having an opposite direction is applied to the coil 413c, a force for moving the bobbin 413b in a rear direction RD of the display panel 100 may be generated based on the application magnetic field and the external magnetic field, as illustrated in FIG. 7B by an arrow. Therefore, as the bobbin 413b moves in the rear direction RD of the display panel 100, the optical module 900 contacting the bobbin 413b may vibrate in the rear direction RD, thereby vibrating the display panel 100. A sound wave generated by the vibration of the display panel 100 may be output to the forward direction FD of the display panel 100. The rear direction RD of the display panel 100 may be as the direction opposite to the forward direction.

Therefore, in the display apparatus according to the present disclosure, the display panel 100 may vibrate in the forward direction FD or the rear direction RD according to a direction and a level of a current applied to the coil 413c, thereby outputting sound in the forward direction FD of the display panel 100. In other words, the optical module 900 may alternately move in the forward direction FD and the rear direction RD according to the current applied to the coil 413c, whereby a vibrating movement of the optical module 900 may be generated. The vibrating movement of the optical module 900 may generate sound that may be output in the forward direction FD of the display panel 100. Therefore, the light optical module 900 may be vibrated by at least one first sound generator, and the display panel 100 may receive the vibration of the optical module 900 to vibrate.

Figure 8A:
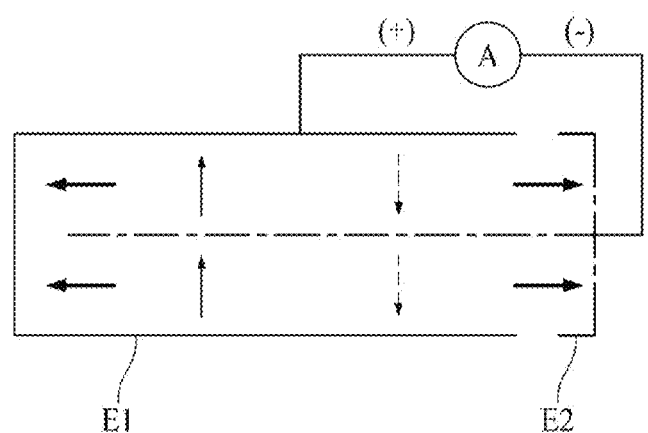
FIGS. 8A and 8B are diagrams for describing a sound generation method of a display apparatus according to an embodiment of the present disclosure.
Figure 8B:
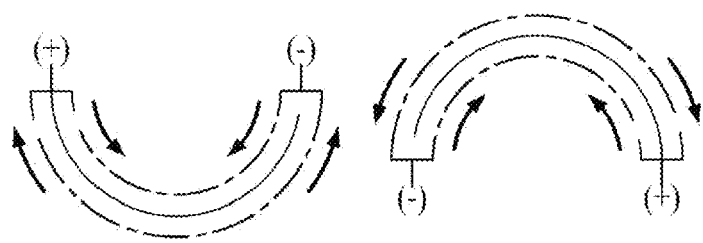

FIGS. 8A and 8B are diagrams for describing a sound generation method of a piezoelectric-type sound generator according to an embodiment of the present disclosure.

A piezoelectric element may be an element having properties (i.e., a piezoelectric effect) where when an external force is applied, electrical polarization occurs to cause a potential difference, but when a voltage is applied, deformation or stress occurs. The piezoelectric element may be realized, for example, as crystal, tourmaline, Rochelle salt (potassium sodium tartrate tetrahydrate), barium titanate ($BaTiO_3$), ammonium dihydrogen phosphate (or monoammonium phosphate) ($NH_4H_2PO_4$), piezoceramics, etc.

Moreover, the piezoelectric element may be formed of an insulation elastic material, such as silicon, acryl, or urethane, or may be a piezoelectric polymer material such as polyvinylidene fluoride (PVDF) or PZT (lead zirconate titanate; a generic name for zirconate $PbZrO_3$ and titanate $PbTiO_3$). PVDF may include polyvinylidene fluoride trifluoroethylene (PVDF-TrFE), and may have a characteristic that is easy to manufacture in a flexible film form.

Therefore, the piezoelectric element may have a structure where the piezoelectric element, including an electrode, is attached to both surfaces of a metal vibration plate or a polymer, e.g., by using an adhesive. A shape of the piezoelectric element may be deformed by applying an alternating current (AC) voltage to both surfaces of the piezoelectric element, and a sound may be generated by transferring the shape deformation of the piezoelectric element to a vibration plate.

A piezoelectric speaker using the piezoelectric element may be categorized into a film-type piezoelectric speaker and a stacked-type piezoelectric speaker. The film-type piezoelectric speaker uses the principle in which an electrode is formed of a piezoelectric film material in each of an upper portion and a lower portion, and a sound may be generated by applying a voltage.

The stacked-type piezoelectric speaker may include a plurality of layers, including a piezoelectric element between two electrodes. An AC voltage may be applied between the two electrodes, and the stacked-type piezoelectric speaker may be bent upward and downward according to the AC voltage. The piezoelectric element may use the above-described materials, but embodiments are not limited thereto. For example, a second sound generator may include the stacked-type piezoelectric speaker, but embodiments are not limited thereto. For example, the film-type piezoelectric speaker may also be applied. This will be described below with reference to FIG. 8.

FIG. 8A is a diagram illustrating a side structure of a sound generator. With reference to FIG. 8A, a positive (+) voltage and a negative (−) voltage may be respectively applied to a first electrode E1 and a second electrode E2. When a voltage having a direction opposite to a polarization direction (illustrated as a solid line) is applied, a stress may be generated based on a piezoelectric effect, and deformation, which may be contracted or expanded in a displacement direction (illustrated as a thick solid line), may occur. Therefore, as illustrated in FIG. 8B, deformation caused by an AC voltage may occur in a piezoelectric-type sound generator, and the piezoelectric-type sound generator may be changed to a vertical motion mode, or may be bent in a displacement direction (illustrated as a thick solid line). A vibration may be generated based on the vertical motion mode, and sound may be generated based on the vibration.

FIGS. 9 to 12 are diagrams illustrating a connection structure of a sound generator and a supporting member in a display apparatus according to an embodiment of the present disclosure.

Figure 9:
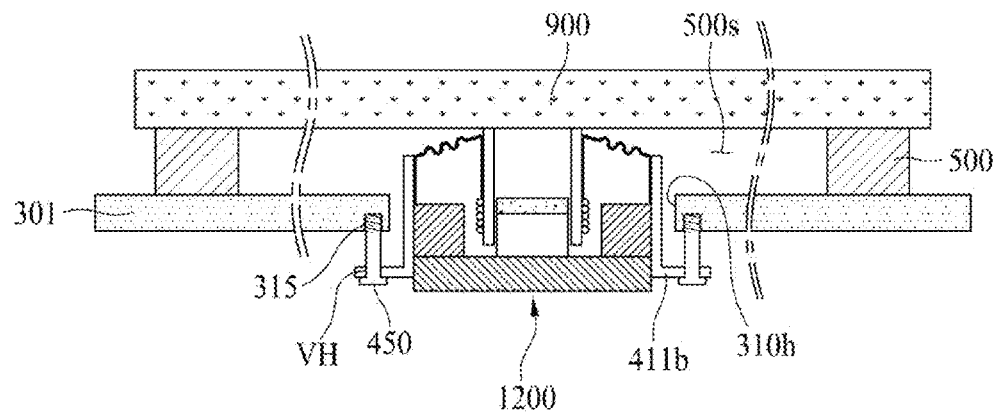
FIGS. 9 to 12 are diagrams illustrating a connection structure of a sound generator and a supporting member in a display apparatus according to an embodiment of the present disclosure.

With reference to FIG. 9, a first sound generator 1200 may be accommodated or inserted into a supporting hole 310h in a rear cover 301, e.g., a supporting member, and in this state, may be fixed to the rear cover 301. For example, a portion, other than a supporting bracket 411b, of the first sound generator 1200 may be accommodated or inserted into the supporting hole 310h of the rear cover 301, and may be connected to a rear surface of an optical module 900. The supporting bracket 411b of the first sound generator 1200 may be fixed to a rear surface, e.g., corresponding to a periphery of the supporting hole 310h of the rear cover 301.

The display apparatus according to an embodiment of the present disclosure may further include a fastening member 450 for connecting the first sound generator 1200 to the rear cover 301. The fastening member 450 may fix the supporting bracket 411b of the first sound generator 1200 to the rear surface of the rear cover 301 to fix the first sound generator 1200 to the rear cover 301. The fastening member 450 may include a head part and a fastening part connected to the head part to include a screw thread. For example, the fastening member 450 may include a bolt or a screw.

The supporting bracket 411b of the first sound generator 1200 may include a through hole VH through which only the fastening part of the fastening member 450 may pass. The rear cover 301 may include a screw hole 315 overlapping the through hole VH, which may be fastened to the fastening part of the fastening member 450. Therefore, the fastening member 450 may be fastened to the screw hole 315 of the rear cover 301 through the through hole VH of the supporting bracket 411b, and may fix the supporting bracket 411b to the rear surface of the rear cover 301, thereby fixing the first sound generator 1200 to the rear cover 301.

A portion of the first sound generator 1200 may be accommodated or inserted into the supporting hole 310h of the rear cover 301, and may be connected to the rear surface of the optical module 900. Thus, a distance between the optical module 900 and the rear cover 301 may be reduced, thereby decreasing a thickness of the display apparatus. For example, the first sound generator 1200 may be between the rear cover 301 and the rear surface of the optical module 900. As such, the distance between the optical module 900 and the rear cover 301 may increase by a thickness (or a height) of the first sound generator 1200. Alternatively, a portion of the first sound generator 1200 may pass through the rear cover 301, thereby decreasing the distance between the optical module 900 and the rear cover 301.

A connection member 500 may be between the optical module 900 and the rear cover 301 to have a particular thickness (or a height). The connection member 500 may have a sealing structure, e.g. having a four-side-sealed type or a closed loop type. The connection member 500 may be between a rear periphery of the optical module 900 and a front periphery of the rear cover 301, and may connect the rear cover 301 to the rear surface of the optical module 900. A space 500s may be between the rear surface of the optical module 900 and the rear cover 301. The space 500s may be used as an accommodation space for a portion of the first sound generator 1200 accommodated into the supporting hole 310h of the rear cover 301, and may be a panel vibration space for a vibration of the display panel 100 caused by driving of the first sound generator 1200. The connection member 500 may be a double-sided tape, a single-sided tape, an adhesive, and/or a bond, but embodiments are not limited thereto.

Figure 10:
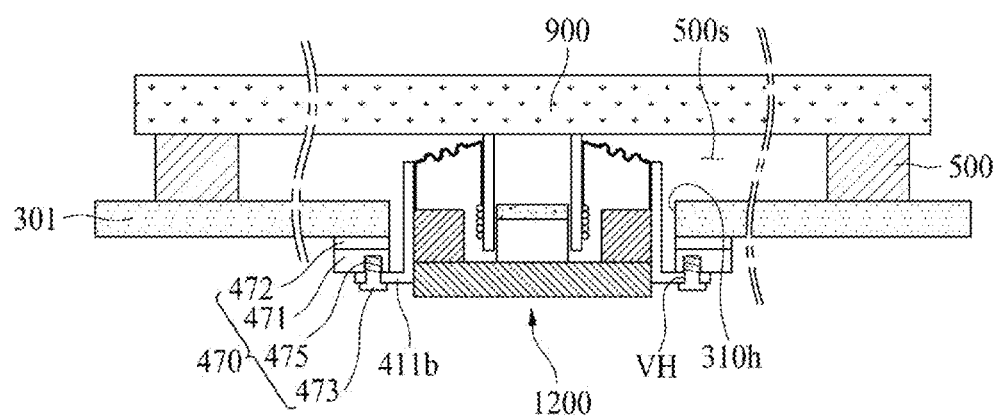

As illustrated in FIG. 10, a display apparatus according to another embodiment of the present disclosure may further include a module securing member 470 that fixes the first sound generator 1200 to a rear surface of the supporting member 300. The module securing member 470 may include a fixing frame 471 attached to the rear surface of the supporting member 300, and a fastening means 473 for fixing the first sound generator 1200 to the fixing frame 471.

The fixing frame 471 may be between the supporting bracket 411*b* of the first sound generator 1200 and the rear surface of the rear cover 301 configuring the supporting member 300 to support the first sound generator 1200. The fixing frame 471 may be attached to the rear cover 301 by an adhesive member 472, such as a double-sided tape, a single-sided tape, an adhesive, and/or a bond. For example, the fixing frame 471 may be formed of rubber, plastic, a metal material, and/or the like, and may have a ring shape. The fixing frame 471 may be referred to as a washer.

The fastening means 473 may fix the supporting bracket 411*b* of the first sound generator 1200 to the fixing frame 471 to fix the first sound generator 1200 to the rear surface of the rear cover 301. The fastening means 473 may include a head part and a fastening part connected to the head part to include a screw thread. For example, the fastening means 473 may include a bolt or a screw.

The supporting bracket 411*b* of the first sound generator 1200 may include a through hole VH through which only the fastening part of the fastening means 473 may pass. The fixing frame 471 may include a screw hole 475 overlapping the through hole VH, and may be fastened to the fastening part of the fastening means 473. Therefore, the fastening means 473 may be fastened to the screw hole 475 of the fixing frame 471 through the through hole VH of the supporting bracket 411*b*, and may fix the supporting bracket 411*b* to a rear surface of the fixing frame 471, thereby fixing the first sound generator 1200 to the rear surface of the rear cover 301 through the fixing frame 471.

A portion of the first sound generator 1200 may be accommodated or inserted into a supporting hole 310*h* of the rear cover 301. Thus, a distance between an optical module 900 and the rear cover 301 may be reduced, thereby decreasing a thickness of the display apparatus. A vibration of the first sound generator 1200 may be buffered by the module securing member 470, thereby reducing or minimizing the vibration transferred from the first sound generator 1200 to the rear cover 301.

A connection member 500 may be between the optical module 900 and the rear cover 301 to have a particular thickness (or a height). The connection member 500 may have a sealing structure, e.g. having a four-side-sealed type or a closed loop type. The connection member 500 may be between a periphery of a rear surface of the optical module 900 and a periphery of a front surface of the rear cover 301, and may connect the rear cover 301 to the rear surface of the optical module 900. A space 500*s* may be between the rear surface of the optical module 900 and the rear cover 301. The space 500*s* may be used for a portion of the first sound generator 1200 to be accommodated into the supporting hole 310*h* of the rear cover 301, and may be a panel vibration space for a vibration of the display panel 100 caused by driving of the first sound generator 1200. The connection member 500 may be a double-sided tape, a single-sided tape, an adhesive, and/or a bond, but embodiments are not limited thereto.

Figure 11:
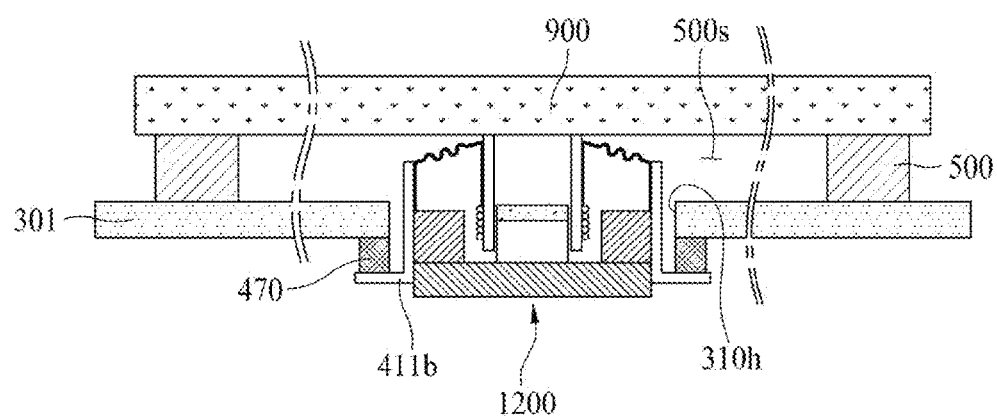

Moreover, as illustrated in FIG. 11, a module securing member 470 according to another embodiment may be a double-sided tape, a single-sided tape, an adhesive, and/or a bond. For example, the first sound generator 1200 may be attached to the rear surface of the rear cover 301 by a double-sided tape, a single-sided tape, an adhesive, and/or a bond. Here, the module securing frame 470, including the double-sided tape, may include an acryl-based material or a urethane-based material. For example, the module securing member 470 may include the urethane-based material having a relatively ductile characteristic, among the acryl-based material and the urethane-based material, to decrease a vibration transferred from the first sound generator 1200 to the rear cover 301. For example, the module securing member 470 may include a foam pad including the urethane-based material and an adhesive layer on each of a front surface and a rear surface of the foam pad. In an embodiment of the present disclosure, a vibration of the first sound generator 1200 may be buffered by using an elastic force of the module securing member 470 including a double-sided tape, a single-sided tape, an adhesive, and/or a bond, thereby decreasing the vibration transferred from the first sound generator 1200 to the rear cover 301.

Moreover, a connection member 500 may be between the optical module 900 and the rear cover 301 to have a particular thickness (or a height). The connection member 500 may have a sealing structure, e.g., having a four-side-sealed type or a closed loop type. The connection member 500 may be between a rear periphery of the optical module 900 and a front periphery of the rear cover 301, and may connect the rear cover 301 to the rear surface of the optical module 900. A space 500*s* may be between the rear surface of the optical module 900 and the rear cover 301. The space 500*s* may be used for a portion of the first sound generator 1200 to be accommodated into a supporting hole 310*h* of the rear cover 301, and may be a panel vibration space for a vibration of the display panel 100 caused by driving of the first sound generator 1200. The connection member 500 may be a double-sided tape, a single-sided tape, an adhesive, and/or a bond, but embodiments are not limited thereto. When the optical module 900 is fixed to the rear cover 301 by a bond, the optical module 900 may be more stably fixed to the rear cover 301.

Figure 12:
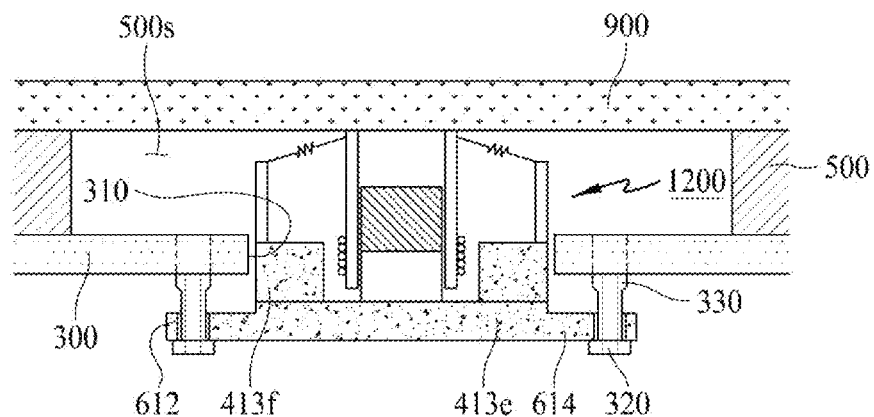

FIG. 12 is a diagram illustrating a connection structure of a sound generator and a supporting member in a display apparatus according to another embodiment of the present disclosure. With reference to FIG. 12, a diameter enlargement part 614 may be provided as one body with a first plate 413*e* of a first sound generator 1200, and an extension part 612 may be in a portion of the diameter enlargement part 614. The first plate 413*e* of the first sound generator 1200 may not have a cylindrical shape, and a protrusion, which may be greater than a diameter of the other side of a first plate 413*e*, may be on one side of the first plate 413*e*. A protrusion region having an enlarged diameter may be referred to as a diameter enlargement part 614. The diameter enlargement part 614 may be provided in a ring shape. The extension part 612 for fixing the first sound generator 1200 may be in a portion of the diameter enlargement part 614. The first sound generator 1200 may be accommodated into a supporting hole 310 in a supporting member 300.

A screw 320 and a nut 330 may be provided in the extension part 612. The first sound generator 1200 may be connected to the supporting member 300 by the screw 320 by using the nut 330 fixed to the supporting member 300. The nut 330 may be, for example, a self-clinching nut. Examples of the self-clinching nut may include a PEM® nut.

If the self-clinching nut is used, some of a vibration generated by the first sound generator 1200 may be absorbed by the self-clinching nut, which is the nut 330. Thus, a vibration transferred to the supporting member 300 may be reduced.

An optical module 900 may be attached to a bobbin 413*b* of the first sound generator 1200. Moreover, a connection member 500 may be between the optical module 900 and the supporting member 300 to have a particular thickness (or a height). The connection member 500 may have a sealing structure, e.g., having a four-side-sealed type or a closed loop type. The connection member 500 may be between a rear periphery of the optical module 900 and a front periphery of the supporting member 300, and may connect the supporting member 300 to the rear surface of the optical module 900. A space 500s may be between the rear surface of the optical module 900 and the supporting member 300. The space 500s may be used for a portion of the first sound generator 1200 to be accommodated into the supporting hole 310 of the supporting member 300, and may be a panel vibration space for a vibration of a display panel 100 caused by driving of the first sound generator 1200. The connection member 500 may be a double-sided tape, a single-sided tape, an adhesive, and/or a bond, but embodiments are not limited thereto.

Figure 13:
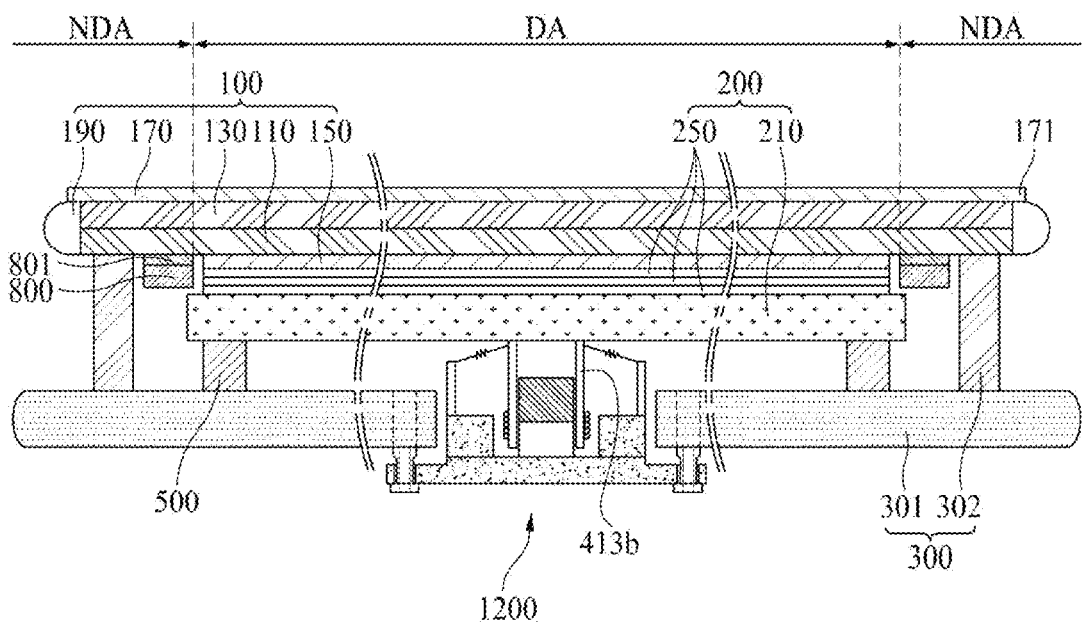
FIG. 13 is a diagram illustrating a display apparatus including a sound generator according to an embodiment of the present disclosure.

In FIGS. 9 to 12, an adhesive member may be further provided between a light guide member 210, as shown in the FIG. 13 example, and the first sound generator 1200. In addition to the connection member 500, the adhesive member may be further provided. Thus, the first sound generator 1200 may be more stably attached to the optical module 900. The adhesive member may be, for example, a double-sided tape, a single-sided tape, an adhesive, and/or a bond, but embodiments are not limited thereto.

In FIGS. 9 to 12, one first sound generator is illustrated as an example, however, as illustrated in FIG. 3B, two or more first sound generators may be provided. Also, as illustrated in FIGS. 15 and 16, two sound generators and a pair of sound generators may be provided.

FIG. 13 is a diagram illustrating a display apparatus including a sound generator according to an embodiment of the present disclosure.

With reference to FIG. 13, the display apparatus according to an embodiment of the present disclosure may include a display panel 100, an optical module 900, a first sound generator 1200, and a second sound generator 800. A connection structure of a supporting member 300 and the first sound generator 1200 is illustrated as the connection structure described above with reference to FIG. 12, but embodiments are not limited thereto. The structure described above with reference to FIGS. 9 to 12 may be similarly applied as the connection structure of the supporting member 300 and the first sound generator 1200.

In the display apparatus according to an embodiment of the present disclosure, the display panel 100 may include a first substrate 110 and a second substrate 130, which may be attached to each other with a liquid crystal layer therebetween. The first substrate 110 may be a thin film transistor (TFT) array substrate, and may include a pixel array part including a plurality of pixels respectively provided in a plurality of pixel areas defined by a plurality of gate lines and a plurality of data lines. The plurality of pixels may each include a TFT connected to a gate line and a data line corresponding thereto, a pixel electrode connected to the TFT, and a common electrode adjacent to the pixel electrode and supplied with a common voltage.

The first substrate may include a pad part in a first periphery thereof, and a gate driving circuit provided in a second periphery thereof. The pad part may supply signals, supplied from the outside, to the pixel array part and the gate driving circuit. For example, the pad part may include a plurality of data pads connected to the plurality of data lines through a plurality of data link lines, and a plurality of gate pads connected to the gate driving circuit through a gate control signal line.

The gate driving circuit may be embedded or integrated into the first periphery of the first substrate to be connected to the plurality of gate lines in a one-to-one relationship. For example, the gate driving circuit may be a shift register including a transistor that may be formed through a similar or the same process as a process of forming TFTs provided in the pixel areas, and may be formed simultaneously therewith. The gate driving circuit may be configured as a gate-in-panel (GIP) type in which the gate driving circuit may be embedded into the display panel 100. For example, a non-display area may be an area in which a GIP is provided. The gate driving circuit may be in one non-display area of a left area and a right area with respect to a display area. For example, the gate driving circuit may be disposed in the non-display area, and may be provided on the first substrate 110 in a chip-on-film (COF) type.

The second substrate 130 may be a color filter array substrate, and may include a black matrix, including an opening area overlapping each of the plurality of pixel areas provided on the first substrate 110, and a color filter in the opening area. The second substrate 130 may be attached to the first substrate 110 by a sealant with the liquid crystal layer therebetween.

The liquid crystal layer may be between the first substrate 110 and the second substrate 130, and may include a liquid crystal, including liquid crystal molecules with an alignment direction that may be changed by an electric field generated by a data voltage applied to the pixel electrode in each of the plurality of pixels and the common voltage applied to the common electrode.

The display panel 100 may include a first polarization member 150 and a second polarization member 170. The first polarization member 150 may be attached to a rear surface of the first substrate 110, and may polarize light, irradiated from the optical module 900 to the first substrate 110, to a first polarization axis. The second polarization member 170 may be attached to a front surface of the second substrate 130, and may polarize light, output to the outside via the second substrate 130, to a second polarization axis that differs from the first polarization axis.

The display panel 100 may further include a side sealing member 190. The side sealing member 190 may cover all of three corners and three outer surfaces of the display panel 100, other than a first outer surface of the display panel 100 adjacent to the pad part. The side sealing member 190 may reduce or prevent light leakage from occurring in a side surface of the display panel 100. The side sealing member 190 may include a silicon-based or ultraviolet (UV) curing-based sealant (or resin). If the side sealing member 190 includes the UV curing-based sealant, a process tack time may be reduced. The side sealing member 190 may have a color (for example, blue, red, blue-green, or black), or may be formed of a colored resin or a light-blocking resin for reducing or preventing side light leakage, without being limited thereto.

A portion of a top of the side sealing member 190 may be covered by the second polarization member 170. The second polarization member 170 may include an extension part 171 extending a long distance from an outer surface of the first substrate 130 to cover a portion of a front surface of the side sealing member 190, and which may be attached to the portion of the front surface of the side sealing member 190. Therefore, a junction surface between the side sealing member 190 and the first substrate 130 may be concealed by the extension part 171 of the second polarization member 170. Thus, the junction surface may not be exposed at a region in front of the display apparatus, e.g., where a viewer may be located. The display panel 100 may drive the liquid crystal layer with an electric field generated in each pixel by a data voltage and the common voltage applied to each pixel, thereby displaying an image by using light passing through the liquid crystal layer.

In the display apparatus according to an embodiment of the present disclosure, the optical module 900 may include a light guide member 210 and an optical sheet part 250. The light guide member 210 may include a light incident surface. The light guide member 210 may be on a rear surface of the display panel 100, and may be connected to the bobbin 413b included in the first sound generator 1200. The light guide member 210 may change a traveling direction of light, incident through the light incident surface, to a direction toward the display panel 100.

The light guide member 210 may include a light-transmitting plastic material or a glass material. For example, the light guide member 210 may be sapphire glass or GORILLA® glass, but may be any glass available for use as a light guide, without being limited thereto.

The light guide member 210 may further include a plurality of optical patterns. For example, if the light guide member 210 includes the light-transmitting plastic material, the plurality of optical patterns may each include an engraved pattern or an embossed pattern on a rear surface of the light guide member 210. In other words, the vibration or vibrations of the at least one first sound generator 1200 may be transferred to the light guide member 210, and may be transferred to the display panel 100.

As another example, if the light guide member 210 is formed of the glass material, the plurality of optical patterns may be inside the light guide member 210. For example, each of the plurality of optical patterns may be in an internal portion, adjacent to a rear surface of the light guide member 210, of the light guide member 210, e.g., through a laser patterning process. Each of the plurality of optical patterns may scatter and refract light incident through the light incident surface, thereby increasing a light output efficiency of light output in a direction toward a front surface of the light guide member 210.

The light guide member 210 may vibrate based on the ascent and descent of the bobbin 413b included in the first sound generator 1200 to vibrate the display panel. Therefore, the light guide member 210 may be vibrated by at least one first sound generator 1200, and the display panel 100 may receive the vibration of the light guide member 210 to vibrate.

A light source module for irradiating light may be included in the light incident surface in the light guide member 210. The light source module according to an embodiment may be mounted on a light source PCB, and may include a plurality of light-emitting diodes (LEDs) for irradiating light onto the light incident surface of the light guide member 210.

The plurality of LEDs may be spaced apart from one another, and may be mounted on the light source PCB. The plurality of LEDs may be spaced apart from the light incident surface of the light guide member 210 by an optical gap, and may be arranged at pitches (or intervals) set along a length direction of the light incident surface provided in the light guide member 210. A pitch (or an interval) and an optical gap between adjacent LEDs of the plurality of LEDs may be set to a range that may reduce or prevent a hot spot caused by a dark portion and a bright portion from occurring in a light incident part of the light guide member 210 including the light incident surface. The light source PCB may be an FPCB.

The optical sheet part 250 may be on a front surface of the light guide member 210, and may be connected to a rear surface of the display panel 100. The optical sheet part 250 may enhance a luminance characteristic of light output from the light guide member 210, and may transfer a vibration of the light guide member 210 to the display panel 100.

The optical sheet part 250 may be a complex optical sheet having a function of diffusing light incident thereon and a function of collecting the diffused light. The complex optical sheet according to an embodiment may be attached to the rear surface of the display panel 100. The complex optical sheet may be positioned on or supported by the front surface of the light guide member 210 to surface-contact the whole front surface of the light guide member 210, without a separate junction member.

As another example, the complex optical sheet may be attached to the rear surface of the display panel 100 by a junction member. For example, the complex optical sheet may be attached to the rear surface of the display panel 100 through a lamination process by using the junction member. If the optical sheet part 250 includes one complex optical sheet, a plurality of light collecting patterns including a prism or lenticular pattern may be additionally provided on the front surface or the rear surface of the light guide member 210.

The junction member according to an embodiment may be a transparent junction member. For example, the junction member may be an optical adhesive, an optical adhesive film, and/or the like, but embodiments are not limited thereto. The junction member may be an optically clear adhesive (OCA), an optically clear resin (OCR), a double-sided tape, a single-sided tape, and/or the like.

According to another embodiment, the optical sheet part 250 may include first to third optical sheets. The first optical sheet may be a first diffusive sheet including a light scattering layer or a light scattering particle, and may be on the front surface of the light guide member 210. The first optical sheet may primarily scatter or diffuse light incident from the light guide member 210 to output the scattered or diffused light.

The second optical sheet may be a second diffusive sheet including a light scattering layer or a light scattering particle, and may be on a front surface of the first optical sheet. The second optical sheet may secondarily scatter or diffuse light incident from the first optical sheet to output the scattered or diffused light.

The third optical sheet may be a prism sheet including a plurality of prism patterns, and may be on a front surface of the second optical sheet. The third optical sheet may collect light incident from the second optical sheet by using the plurality of prism patterns to output the collected light.

Moreover, the second optical sheet may be replaced by a lower prism sheet. The lower prism sheet according to an embodiment may include a plurality of lower prism patterns extending a long distance in a horizontal axis direction, which may contact each other in a vertical axis direction. In this case, the third optical sheet may be an upper prism sheet. The upper prism sheet according to an embodiment may include a plurality of upper prism patterns extending a long distance in a vertical axis direction, which may contact each other in a horizontal axis direction. Therefore, the lower prism patterns and the upper prism patterns may intersect one another.

For example, the third optical sheet may be attached to the rear surface of the display panel 100 by a junction member. The second optical sheet may be attached to a whole rear surface of the third optical sheet by a first sheet junction member. The first optical sheet may be attached to a whole rear surface of the second optical sheet by a second sheet junction member. The first and second sheet junction members according to an embodiment may each be an optical adhesive or an optical adhesive film, but embodiments are not limited thereto. For example, the first and second sheet junction members may each be an OCA, an OCR, and/or the like.

The supporting member 300 may include a rear cover 301 and a side supporting member 302. The rear cover 301 and the light guide member 210 may be fixed to a connection member 500. The connection member 500 may be a double-sided tape, a single-sided tape, an adhesive, and/or a bond, but embodiments are not limited thereto.

In the display apparatus including an optical module according to an embodiment of the present disclosure, an air gap occurring between the light guide member 210 and the optical sheet part 250 may be removed. Thus, a vibration may be transferred to the display panel 100 through the optical sheet part 250 without any reduction in vibration of the light guide member 210. Accordingly, the display apparatus according to an embodiment of the present disclosure may vibrate the display panel 100 to output sound without reduction in a sound pressure caused by a multilayer structure between the light guide member 210 and the display panel 100 in a vibration transfer process.

In FIG. 13, one first sound generator is illustrated as an example, but as illustrated in FIG. 3B, two or more first sound generators may be provided. Also, as in the examples of FIGS. 15 and 16, two sound generators and/or a pair of sound generators may be provided.

A first sound generator may generate sound in a middle-low-pitched sound band. To generate sound in a high-pitched sound band, a second sound generator 800 may be further provided in a non-display area NDA. For example, the second sound generator 800 may be in the non-display area NDA, and may be on a rear surface of a first substrate 110, e.g., using an adhesive member 801. A second sound generator will be described below with reference to FIGS. 14A to 14F.

FIGS. 14A to 14F are diagrams illustrating a sound generator according to an embodiment of the present disclosure.

Figure 14A:
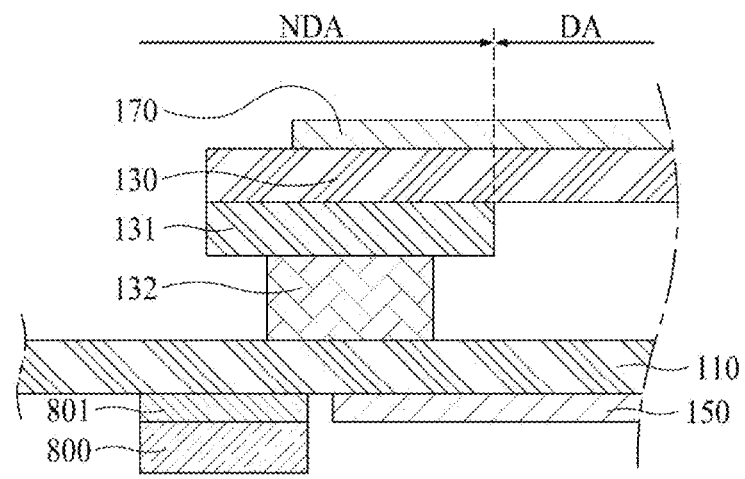
FIGS. 14A to 14F are diagrams illustrating a sound generator according to an embodiment of the present disclosure.

FIG. 14A is an enlarged view of a second sound generator disposed in a non-display area in FIG. 13. With reference to FIGS. 14A to 14F, a display panel 100 may include a display area DA and a non-display area NDA. A second polarization member 170 on a second substrate 130 may be in the non-display area NDA, and a black matrix 131 may be on the second substrate 130. A first polarization member 150 may be on a first substrate 110. Using a sealant 132, the second substrate 130 may be attached to the first substrate 110 with a liquid crystal layer therebetween.

With reference to FIG. 14A, a second sound generator 800 may be on a rear surface of the first substrate 110 in the non-display area NDA. For example, the second sound generator 800 may be between the first substrate 110 and the first polarization member 150. For example, the second sound generator 800 may be between an outer circumference surface of the first substrate 110 and an outer circumference surface of the first polarization member 150. Also, the second sound generator 800 may be a piezoelectric-type sound generator.

The second sound generator 800 may be attached to the first substrate 110 by an adhesive member 801. The adhesive member 801 may be a double-sided tape, a single-sided tape, an adhesive, a bond, and/or the like, but embodiments are not limited thereto. A position at which the second sound generator 800 may be disposed is not limited to the example of FIG. 14A, and another embodiment where the second sound generator 800 is disposed in the non-display area NDA will be described below with reference to FIGS. 14B to 14F.

Figure 14B:
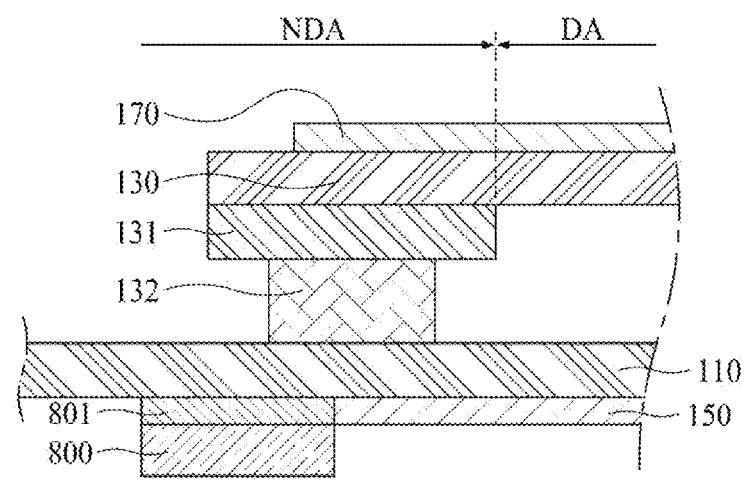

With reference to FIG. 14B, a second sound generator 800 may be on the rear surface of the first substrate 110 in the non-display area NDA. For example, the second sound generator 800 may be between the first substrate 110 and the first polarization member 150. The second sound generator 800 may be a piezoelectric-type sound generator. The second sound generator 800 may be attached to the first substrate 110 by an adhesive member 801. The adhesive member 801 may be a double-sided tape, a single-sided tape, an adhesive, a bond, and/or the like, but embodiments are not limited thereto.

In FIG. 14A, the second sound generator 800 and the first polarization member 150 have an interval or a distance therebetween. FIG. 14B illustrates an example in which the second sound generator 800 and the first polarization member 150 do not have an interval or a distance therebetween.

Figure 14C:
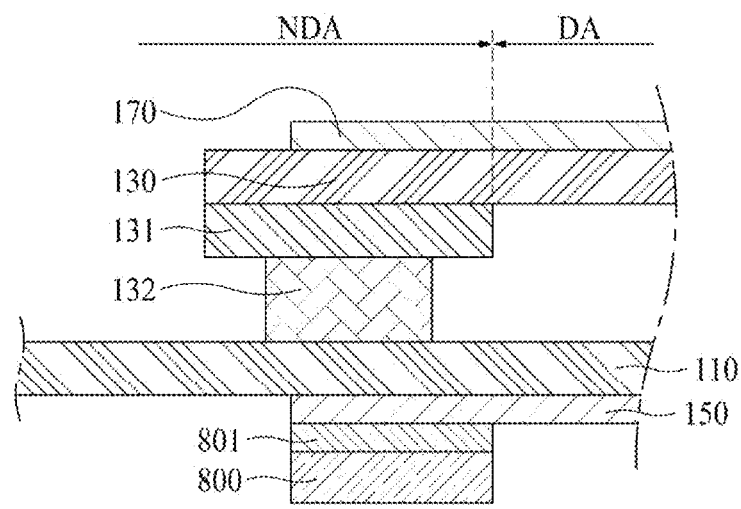

With reference to FIG. 14C, a second sound generator 800 may be on a rear surface of the first polarization member 150 in the non-display area NDA. The second sound generator 800 may be a piezoelectric-type sound generator. The second sound generator 800 may be attached to the first polarization member 150 by an adhesive member 801. The adhesive member 801 may be a double-sided tape, a single-sided tape, an adhesive, a bond, and/or the like, but embodiments are not limited thereto.

Figure 14D:
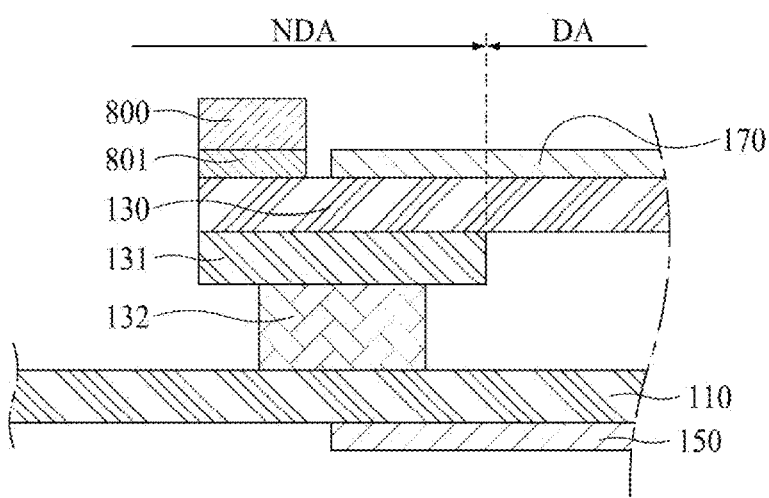

With reference to FIG. 14D, a second sound generator 800 may be on an upper surface of the second substrate 130 in the non-display area NDA. For example, the second sound generator 800 may be between the second substrate 130 and the second polarization member 170. The second sound generator 800 may be a piezoelectric-type sound generator. The second sound generator 800 may be attached to the second substrate 130 by an adhesive member 801. The adhesive member 801 may be a double-sided tape, a single-sided tape, an adhesive, a bond, and/or the like, but embodiments are not limited thereto.

Figure 14E:
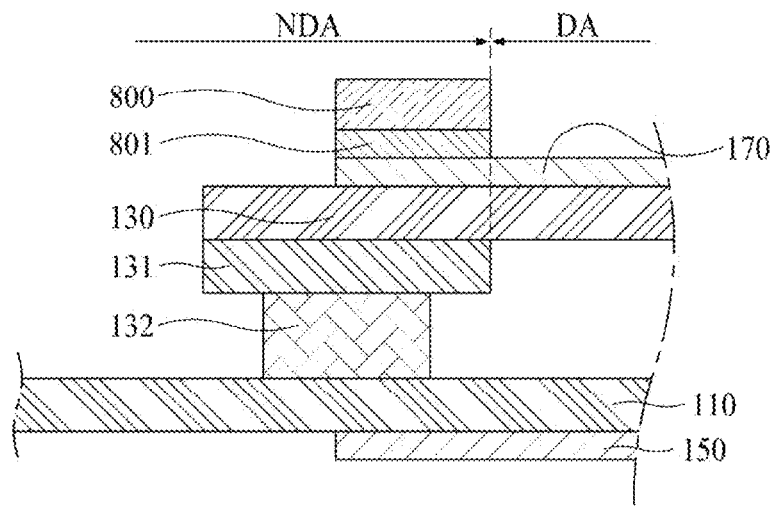

With reference to FIG. 14E, a second sound generator 800 may be on a rear surface of the second polarization member 170 in the non-display area NDA. The second sound generator 800 may be a piezoelectric-type sound generator. The second sound generator 800 may be attached to the second polarization member 170 by an adhesive member 801. The adhesive member 801 may be a double-sided tape, a single-sided tape, an adhesive, a bond, and/or the like, but embodiments are not limited thereto.

Figure 14F:
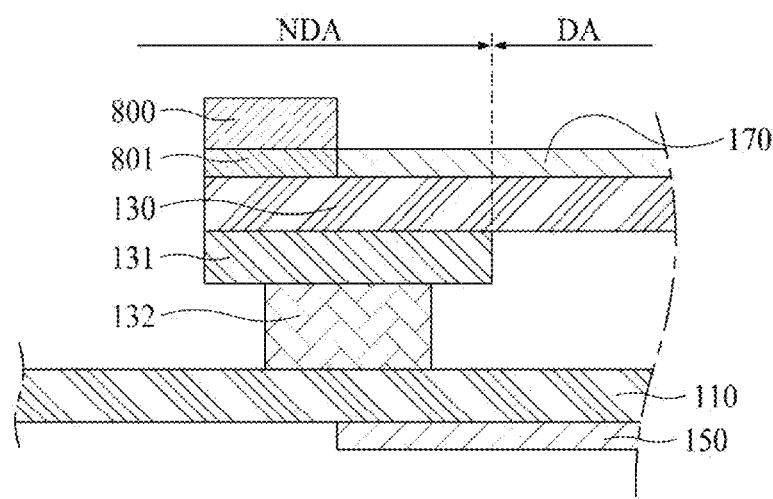

With reference to FIG. 14F, a second sound generator 800 may be on a rear surface of the second substrate 130 in the non-display area NDA. For example, the second sound generator 800 may be between the second substrate 130 and the second polarization member 170. The second sound generator 800 may be a piezoelectric-type sound generator. The second sound generator 800 may be attached to the second substrate 130 by an adhesive member 801. The adhesive member 801 may be a double-sided tape, a single-sided tape, an adhesive, a bond, and/or the like, but embodiments are not limited thereto.

In FIG. 14D, the second sound generator 800 and the second polarization member 170 have an interval or a distance therebetween. FIG. 14F illustrates an example in which the second sound generator 800 and the second polarization member 170 do not have an interval or a distance therebetween.

In FIGS. 14A to 14F, a driving circuit unit for driving the display panel 100 may be provided. A gate driving circuit of the driving circuit unit may be configured as a GIP type in which the gate driving circuit is embedded into the display panel 100. For example, a non-display area may be an area in which a GIP is provided. The gate driving circuit may be in one non-display area of a left area and a right area with respect to a display area. For example, the gate driving circuit may be in the non-display area, and may be on the first substrate 110 in a COF type. The second sound generator 800 may be a top of a COF. For example, the second sound generator 800 may be in the non-display area on the top surface of the COF. Also, for example, the second sound generator 800 may be in one corner portion or one periphery of a left area and a right area of the non-display area.

As described above with reference to FIGS. 14A to 14F, the second sound generator 800 may generate sound by using the non-display area NDA or a bezel area as a vibration plate. Accordingly, a degree of freedom in disposition of the second sound generator 800 may be enhanced, regardless of a position of the second sound generator 800 in the non-display area NDA. For example, the second sound generator 800 may be disposed at any or all positions including left, right, upper, and lower positions of the non-display area NDA. Because the second sound generator 800 is not disposed in the display area DA in which an optical module and the like are disposed, a sound path may not be blocked by the optical module and the like. Thus, sound quality may be enhanced. A thickness of the second sound generator 800 may be thin. Thus, a small speaker may be provided in the display apparatus.

The second sound generator 800 may be in, for example, an area corresponding to the black matrix 131 in the non-display area NDA. The black matrix 131 may be in an outermost portion of the display panel 100, and the area may be an area on which the second sound generator 800 for generating a high-pitched sound may be capable of being attached. In this case, the black matrix 131 may act as a vibration plate of the second sound generator 800.

An example in which two coil-type sound generators are provided in a region of the display panel has been described above with reference to FIGS. 3A to 14F. Another embodiment of a sound generator will be described below with reference to FIGS. 15A and 16C.

Figure 15A:
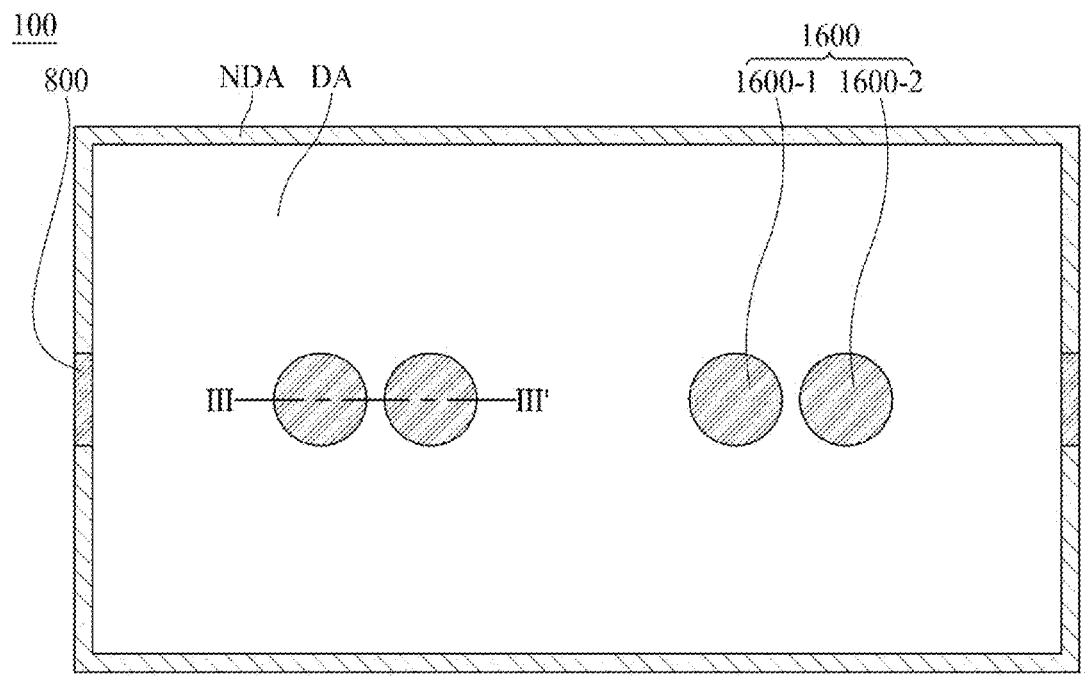
FIGS. 15A and 15B are diagrams illustrating another example of a sound generator in a display apparatus according to an embodiment of the present disclosure.
Figure 15B:
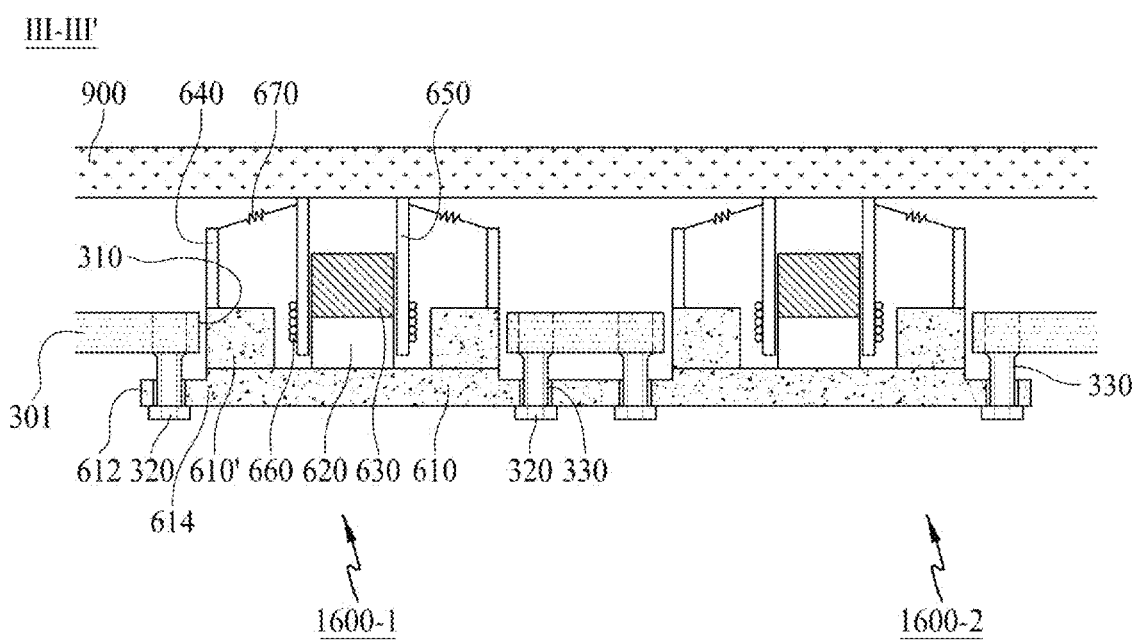

FIGS. 15A and 15B are diagrams illustrating another example of a sound generator in a display apparatus according to an embodiment of the present disclosure.

A display area DA may include at least two areas, and an example in which two coil-type sound generators are provided in each of the two areas will be described below. The two areas may include a first area and a second area. The first area may be a left area of the display area DA, and the second area may be a right area of the display area DA.

With reference to FIG. 15A, a coil-type sound generator, which may be a first sound generator 1600, may be in a display area DA. A 1-1$^{st}$ sound generator 1600-1 and a 1-2$^{nd}$ sound generator 1600-2 may be in each of a first area and a second area of the display area DA. A piezoelectric-type sound generator, which may be a second sound generator 800, may be in a non-display area NDA.

FIG. 15B is a cross-sectional view taken along line of FIG. 15A, and is a diagram illustrating a connection structure of a first sound generator 1600 and a supporting member 300. The embodiments are not limited thereto, and descriptions given above with reference to FIGS. 9 to 11 may be similarly applied. The first sound generator 1600 will be described with the sound generator of FIG. 6 as an example, but a structure of the sound generator of FIG. 5 may also be applied.

With reference to FIG. 15B, a 1-1$^{st}$ sound generator 1600-1 and a 1-2$^{nd}$ sound generator 1600-2, included in a first sound generator 1600, may each include a magnet 620 on a first plate 610, a center pole 630 on the magnet 620, a bobbin 650 near the magnet 620 and the center pole 630, and a coil 660 wound around an outer portion of the bobbin 650. A second plate 610' may be near an outer portion of the first plate 610, and a frame 640 may be outside the second plate 610'. A damper 670 may be between the frame 640 and the bobbin 650. A description of a sound generator is substantially similar to the description given above with reference to the examples of FIGS. 5 and 6. Thus, a detailed description of the sound generator is omitted.

A diameter enlargement part 614 may be provided as one body with the first plate 610 of each of the 1-1$^{st}$ sound generator 1600-1 and the 1-2$^{nd}$ sound generator 1600-2. The first plate 610 of the first sound generator 1600 may have a cylindrical shape, and a protrusion larger than a diameter of the other side of the first plate 610 may be on one side of the first plate 610. A protrusion region having an enlarged diameter may be referred to as a diameter enlargement part 614. The diameter enlargement part 614 may have a ring shape. Also, an extension part 612 for fixing the 1-1$^{st}$ sound generator 1600-1 and the 1-2$^{nd}$ sound generator 1600-2 may be in a portion of the diameter enlargement part 614.

A screw 320 and a nut 330 may be provided in the extension part 612. The nut 330 may be, for example, a self-clinching nut. Examples of the self-clinching nut may include a PEM® nut. Also, the 1-1$^{st}$ sound generator 1600-1 and the 1-2$^{nd}$ sound generator 1600-2 may be connected to a supporting member 300 by the nut 330 and the screw 320.

If the self-clinching nut is used for connecting the supporting member 300 to the first sound generator 1600, some of a vibration generated by the first sound generator 1600 may be absorbed by the self-clinching nut. Thus, a vibration transferred to the supporting member 300 may be reduced.

When the supporting member 300 is directly connected to the first sound generator 1600 without the self-clinching nut, a vibration occurring when the first sound generator 1600 operates may be transferred to the supporting member 300 after operation for a long time. As such, if the supporting member 300 is thin, the supporting member 300 may be bent or deformed. If the supporting member 300 is thin, the first sound generator 1600 may be directly connected to the screw 320 of the supporting member 300. Thus, a fixing force between the supporting member 300 and the first sound generator 1600 may not be sufficient.

Therefore, if a nut is provided for fixing a sound generation device to a supporting member, a thickness of the supporting member may be thickened for reducing or preventing the bending or deformation of the supporting member, and for enhancing a fixing force between the supporting member and the sound generation device. When the thickness of the supporting member is thickened, a thickness of a display apparatus may be thickened. If the supporting member is formed of glass or stainless steel, e.g., for improving an aesthetic design appearance of the display apparatus, a nut may not be inserted into the supporting member.

Therefore, a second supporting member may be further provided on the supporting member 300, e.g., in order for the nut 330 to be inserted into the supporting member 300.

The second supporting member may be on a side of the supporting member 300 adjacent to the optical module 900.

Moreover, the second supporting member may be formed of aluminum (Al), and the nut 330 may be inserted into the second supporting member. The first sound generator 1600 may be connected to the supporting member 300 and the second supporting member by the screw 320 by using the nut 330 fixed to the supporting member 300. Also, the supporting member 300 and the second supporting member may be fixed by an adhesive member. The adhesive member may be a double-sided tape, a single-sided tape, an adhesive, a bond, and/or the like, but embodiments are not limited thereto. If the supporting member 300 and the second supporting member are fixed by the bond, the supporting member 300 and the second supporting member are more stably fixed.

The supporting member 300 may be formed of glass, stainless steel, and/or the like. Thus, an aesthetic design appearance of a display apparatus may be improved. Also, the second supporting member may be further provided. Thus, the first sound generator 1600 may be disposed closer to a front surface of an optical module 900 by a distance corresponding to a thickness of the supporting member 300, thereby reducing a thickness of the display apparatus. Therefore, the second supporting member may be further provided. Thus, the sound generator may be thinner provided, thereby reducing the thickness of the display apparatus.

Moreover, an adhesive member for attaching the optical module 900 on the first sound generator 1600 may be further provided. The adhesive member may be a double-sided tape, a single-sided tape, an adhesive, a bond, and/or the like, but embodiments are not limited thereto. If the optical module 900 is fixed to the first sound generator 1600 by the bond, the optical module 900 is more stably fixed to the first sound generator 1600.

Figure 16A:
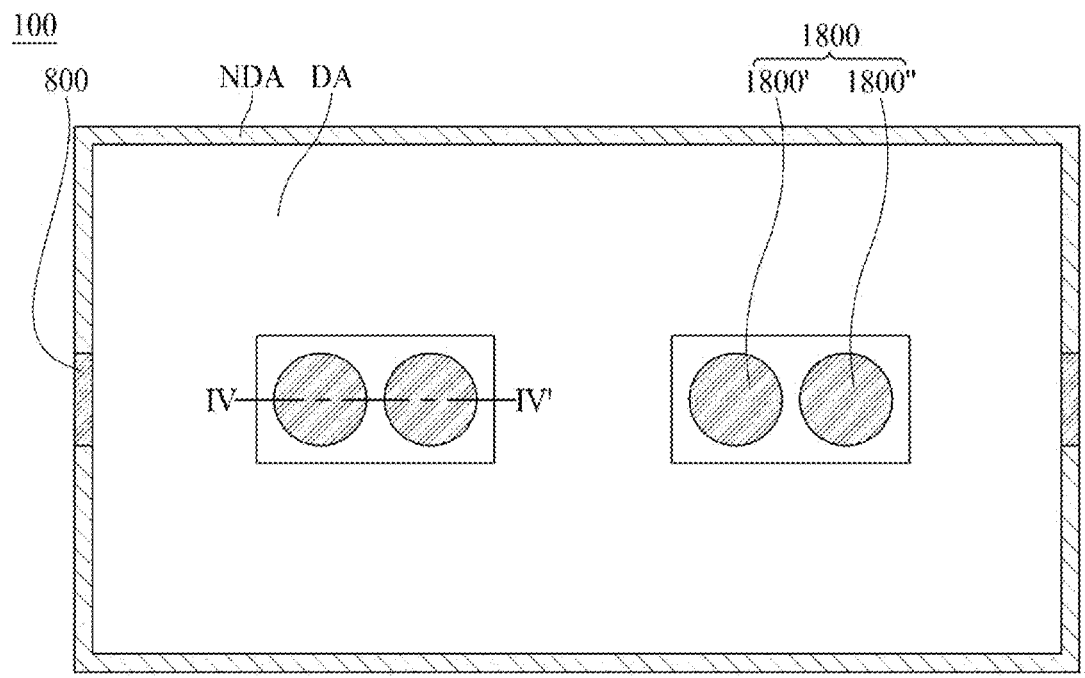
FIGS. 16A to 16C are diagrams illustrating another example of a sound generator in a display apparatus according to an embodiment of the present disclosure.
Figure 16B:
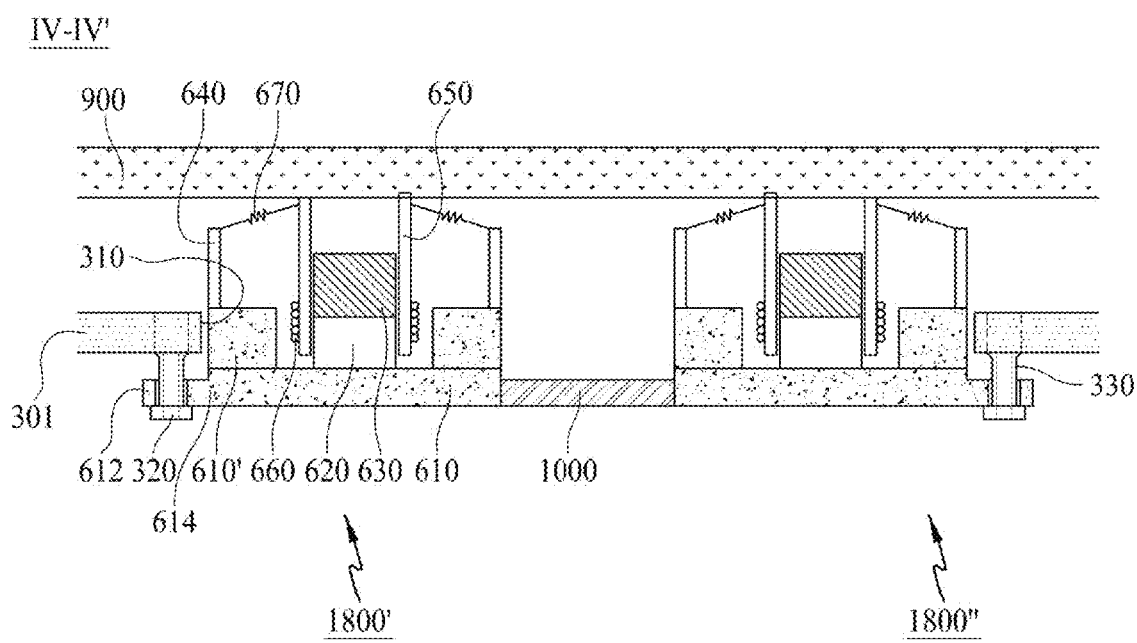
Figure 16C:
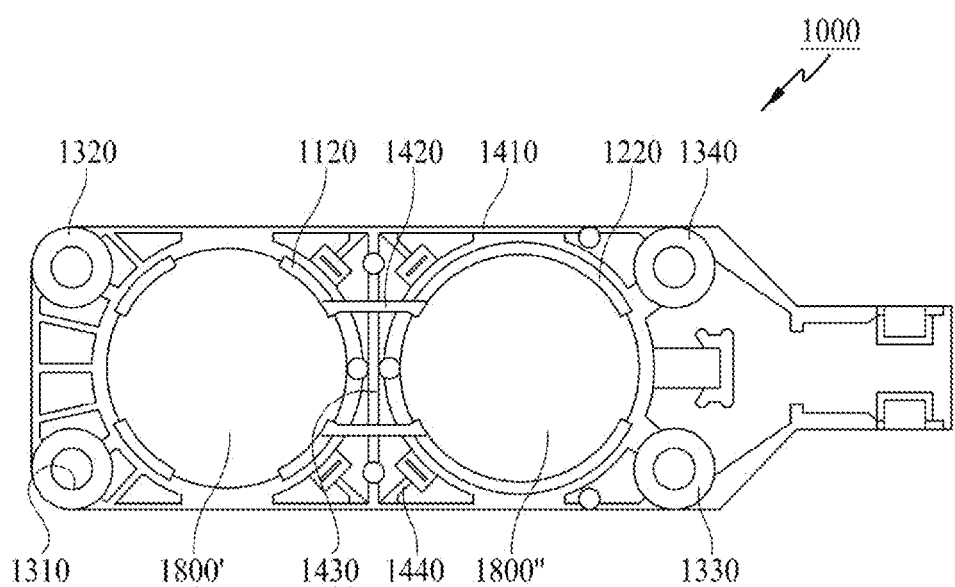

FIGS. 16A to 16C are diagrams illustrating another example of a sound generator in a display apparatus according to an embodiment of the present disclosure.

A display area DA may include at least two areas, and an example in which a pair of coil-type sound generators are provided in each of the two areas will be described below. The two areas may include a first area and a second area. The first area may be a left area of the display area DA, and the second area may be a right area of the display area DA.

With reference to FIG. 16A, a coil-type sound generator, which may be a first sound generator 1800, may be in a display area DA. The first sound generator 1800 may include a 1-$1^{st}$ sound generator 1800' and a 1-$2^{nd}$ sound generator 1800'' which are respectively in a first area and a second area of the display area DA. Also, a piezoelectric-type sound generator, which may be a second sound generator 800, may be in a non-display area NDA.

FIG. 16B is a cross-sectional view taken along line IV-IV' of FIG. 16A and is a diagram illustrating a connection structure of a first sound generator 1800 and a supporting member 300. Embodiments are not limited thereto, and descriptions given above with reference to the examples of FIGS. 9 to 11 may be similarly applied. The first sound generator 1800 will be described with the sound generator of FIG. 6 as an example, and a structure of the sound generator of FIG. 5 may also be applied.

With reference to FIG. 16B, a 1-$1^{st}$ sound generator 1800' and a 1-$2^{nd}$ sound generator 1800'', included in a first sound generator 1800 may each include a magnet 620 on a first plate 610, a center pole 630 on the magnet 620, a bobbin 650 near the magnet 620 and the center pole 630, and a coil 660 wound around an outer portion of the bobbin 650. A second plate 610' may be near an outer portion of the first plate 610, and a frame 640 may be outside the second plate 610'. Also, a damper 670 may be between the frame 640 and the bobbin 650. A description of a sound generator is substantially similar to the description given above with reference to the examples of FIGS. 5 and 6. Thus, a detailed description of the sound generator is omitted.

A diameter enlargement part 614 may be formed as one body with the first plate 610 of each of the 1-$1^{st}$ sound generator 1800' and the 1-$2^{nd}$ sound generator 1800''. The first plate 610 of the first sound generator 1800 may have a cylindrical shape, and a protrusion larger than a diameter of the other side of the first plate 610 may be on one side of the first plate 610. A protrusion region having an enlarged diameter may be referred to as a diameter enlargement part 614. The diameter enlargement part 614 may have a ring shape. An extension part 612 for fixing the first plate 610 of each of the 1-$1^{st}$ sound generator 1800' and the 1-$2^{nd}$ sound generator 1800'' may be in a portion of the diameter enlargement part 614.

A screw 320 and a nut 330 may be in the extension part 612. The nut 330 may be, for example, a self-clinching nut. Examples of the self-clinching nut may include a PEM® nut. Also, the 1-$1^{st}$ sound generator 1800' and the 1-$2^{nd}$ sound generator 1800'' may be connected to a supporting member 300 by the nut 330 and the screw 320.

If the self-clinching nut is used for connecting the supporting member 300 to the first sound generator 1800, some of a vibration generated by the first sound generator 1800 may be absorbed by the self-clinching nut. Thus, a vibration transferred to the supporting member 300 may be reduced.

When the supporting member 300 is directly connected to the first sound generator 1800 without the self-clinching nut, a vibration occurring when the first sound generator 1800 operates may be transferred to the supporting member 300 after operation for a long time. Thus, if the supporting member 300 is thin, the supporting member 300 may be bent or deformed. If the supporting member 300 is thin, the first sound generator 1800 may be directly connected to the screw 320 of the supporting member 300. Thus, a fixing force between the supporting member 300 and the first sound generator 1800 may not be sufficient.

Therefore, if a nut is provided for fixing a sound generation device to a supporting member, a thickness of the supporting member may be thickened for reducing or preventing the bending or deformation of the supporting member, and for enhancing a fixing force between the supporting member and the sound generation device. When the thickness of the supporting member is thickened, a thickness of a display apparatus may be thickened. If the supporting member is formed of glass or stainless steel, e.g., for improving an aesthetic design appearance of the display apparatus, a nut may not be inserted into the supporting member.

Therefore, a second supporting member may be further provided on the supporting member 300 in order for the nut 330 to be inserted into the supporting member 300. The second supporting member may be on a side of the supporting member 300 adjacent to the optical module 900.

Moreover, the second supporting member may be formed of Al, and the nut 330 may be inserted into the second supporting member. The first sound generator 1800 may be connected to the supporting member 300 and the second supporting member by the screw 302 by using the nut 330 fixed to the supporting member 300. Also, the supporting member 300 and the second supporting member may be fixed by an adhesive member. The adhesive member may be a double-sided tape, a single-sided tape, an adhesive, a bond, and/or the like, but embodiments are not limited thereto. If the supporting member 300 and the second supporting member are fixed by the bond, the supporting member 300 and the second supporting member may be more stably fixed.

The supporting member 300 may be formed of glass, stainless steel, and/or the like. Thus, an aesthetic design appearance of a display apparatus may be improved. The second supporting member may be further provided. Thus, the first sound generator 1800 may be closer to a front surface of an optical module 900 by a distance corresponding to a thickness of the supporting member 300, thereby reducing a thickness of the display apparatus. Thus, the sound generator may be thinner, thereby reducing the thickness of the display apparatus.

An adhesive member for attaching the optical module 900 to the first sound generator 1800 may be further provided. The adhesive member may be a double-sided tape, a single-sided tape, an adhesive, a bond, and/or the like, but embodiments are not limited thereto.

A pair of sound generators 1800 may be fixed by a fixing device 1000. The fixing device 1000 for fixing the pair of sound generators 1800 will be described below with reference to FIG. 16C.

With reference to FIG. 16C, the fixing device 1000 of a first sound generator 1800 may be an integrated fixing device that fixes and supports a $1\text{-}1^{st}$ sound generation device 1800' and a $1\text{-}2^{nd}$ generation device 1800" to be adjacent to each other. Therefore, the $1\text{-}1^{st}$ sound generation device 1800' and the $1\text{-}2^{nd}$ generation device 1800" fixed by the fixing device 1000 may be referred to as a "pair of sound generators."

The fixing device 1000 of the sound generator 1800 may include a supporting part that supports the sound generator, a plurality of rib parts near the sound generator, and a plurality of mounting holes for fixing the fixing device 1000 to a supporting member. For example, the supporting part may include a first supporting part 1120 that supports the $1\text{-}1^{st}$ sound generator 1800' and a second supporting part 1220 that supports the $1\text{-}2^{nd}$ sound generator 1800". The first supporting part 1120 may be a structure that supports a portion of a side surface and a rear surface of the $1\text{-}1^{st}$ sound generator 1800', and may have a cylindrical shape. The second supporting part 1220 may be a structure that supports a portion of a side surface and a rear surface of the $1\text{-}2^{nd}$ sound generator 1800", and may have a cylindrical shape.

The first supporting part 1120 and the second supporting part 1220 may further include two or four arc-shaped protrusions. One surface of each of the protrusions may be bent toward an inner side of each of the $1\text{-}1^{st}$ sound generator 1800' and the $1\text{-}2^{nd}$ sound generator 1800", and may support a portion of a rear surface of each of the $1\text{-}1^{st}$ sound generator 1800' and the $1\text{-}2^{nd}$ sound generator 1800", thereby reducing or preventing the $1\text{-}1^{st}$ sound generator 1800' and the $1\text{-}2^{nd}$ sound generator 1800" from deviating to the outside of the fixing device 1000 of the sound generator.

A plurality of rib parts may be near the first supporting part 1120 and the second supporting part 1220, e.g., for maintaining a rigidity or hardness of the fixing device 1000 of the first sound generator 1800, and for reducing or preventing the fixing device 1000 of the first sound generator 1800 from being deformed, even when being used for a long time.

For example, the rib parts may include a first rib part 1410 extending in a widthwise direction from an outer portion of the first and second supporting parts 1120 and 1220, a second rib part 1420 connecting the first supporting part 1120 to the second supporting part 1220 in the widthwise direction, and a third rib part 1430 connected to the first rib part 1410 in a lengthwise direction. For example, the widthwise direction may be a direction toward a long side on which two sound generators are disposed, and the lengthwise direction may be a direction vertical to the widthwise direction. The first rib part 1410 may extend long in a widthwise direction from the outer portion of each of the first and second supporting parts 1120 and 1220 to form a widthwise-direction external structure of the fixing device 1000 of the first sound generator 1800.

In a center area (e.g., a center area between the first supporting part 1120 and the second supporting part 1220) of the first rib part 1410, the first rib part 1410 may be provided higher in height than and thicker in thickness than both side areas of the first rib part 1410. Therefore, even when a pair of sound generators vibrates for a long time, a fixing device of each of the pair of sound generators may not be deformed, and a relative position change between the pair of sound generators and an optical module may be reduced. At least one second rib part 1420, at which the first supporting part 1120 and the second supporting part 1220 are connected to each other as one body, may be inside the first rib part 1410.

In FIG. 16C, two second rib parts 1420 are illustrated as being provided, but embodiments are not limited thereto. For example, the second rib part 1420 may be provided as one, three, or more. At least one third rib part 1430, connected to the first and second rib parts 1410 and 1420 as one body and extending in the lengthwise direction, may be provided between two second rib parts 1420 or between two first rib parts 1410.

In FIG. 16C, a structure in which one third rib part 1430 is provided and extends long between two first rib parts 1410 is illustrated. However, embodiments are not limited thereto, and the third rib part 1430 may extend shortly between two second rib parts 1420.

At least one fourth rib part 1440, obliquely extending between the first supporting part 1120 or the second supporting part 1220 and the first rib part 1410, may be further provided. The fourth rib part 1440 may reduce or prevent the bending deformation of the fixing device 1000 of the sound generator caused by long-time driving of the sound generator. Therefore, because the display apparatus according to the present embodiment includes the fixing device fixing the pair of sound generators and the plurality of rib parts near the sound generators, the rigidity of the sound generation devices may be maintained, and a sound characteristic change caused by a long-time operation may be reduced.

Moreover, a distance between the first supporting part 1120 and the second supporting part 1220 may be greater than a minimum threshold value that enables a rib part to be formed, and may be smaller than a maximum threshold value that is a diameter of each of the $1\text{-}1^{st}$ sound generator 1800' and the $1\text{-}2^{nd}$ sound generator 1800". If the distance between the first supporting part 1120 and the second supporting part 1220 is greater than the minimum threshold value, the degradation in sound quality may be reduced. Therefore, the distance between the first supporting part 1120 and the second supporting part 1220 may be smaller than the diameter of each of the $1\text{-}1^{st}$ sound generator 1800' and the $1\text{-}2^{nd}$ sound generator 1800". Thus, the degradation in sound quality may be reduced. For example, if a size (or a diameter) of the sound generation device is "D", the distance should be smaller than the size D of the sound generation device and greater than about 7 mm, which is the minimum threshold value. It can be seen that the change in sound quality characteristic is not greater when the size D of the sound generator is about 28 mm, than when the size D of the sound generator is about 0.85*D (e.g., about 23.6 mm). Embodiments are not limited to these sizes.

Moreover, a plurality of mounting holes for fixing the fixing device 1000 to the supporting member 300 may be provided. When the hole is provided in the inner surface of the nut 330 illustrated in FIG. 16B, a plurality of mounting holes 1310, 1320, 1330, and 1340 of the fixing device 1000 may be aligned with the hole of the nut 330. Then, by fastening the screw 320, the fixing device 1000 may be fixed to the supporting member 300.

FIGS. 17A to 17D are diagrams illustrating an example of a sound generator and a partition in a display apparatus according to an embodiment of the present disclosure.

Figure 17A:
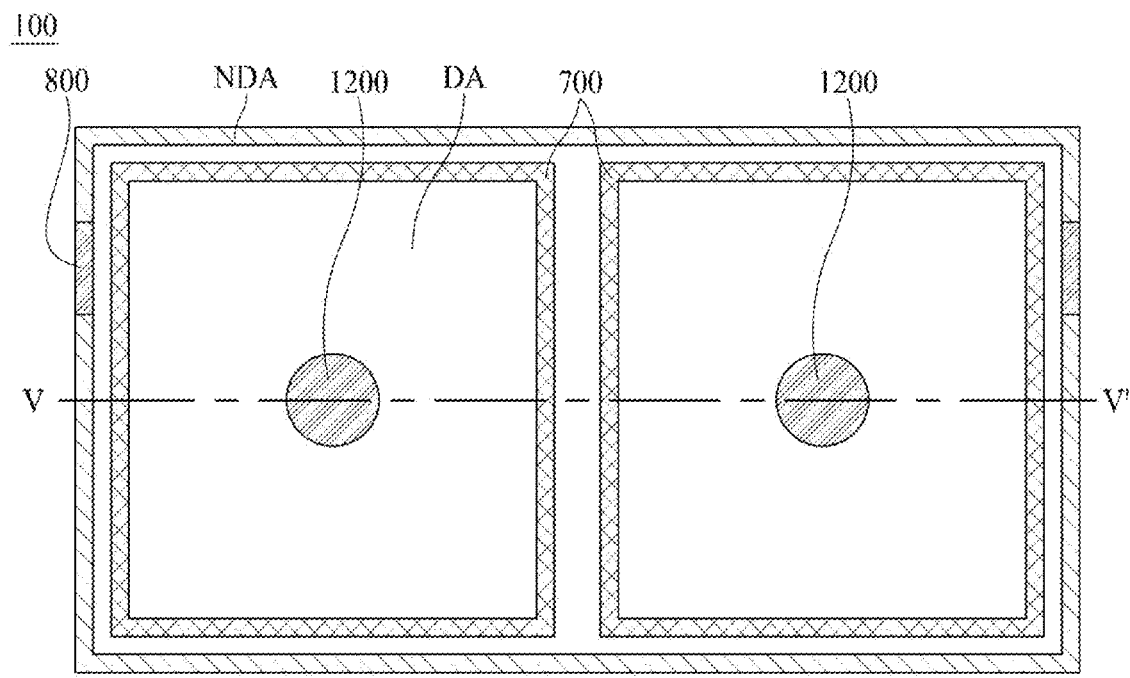
FIGS. 17A to 17D are diagrams illustrating an example of a sound generator and a partition in a display apparatus according to an embodiment of the present disclosure.

With reference to FIG. 17A, a display area DA may include at least two areas, and an example in which two coil-type sound generators are provided in each of the two areas will be described below. The two areas may include a first area and a second area. The first area may be a left area of the display area DA, and the second area may be a right area of the display area DA.

A partition 700 may be near a first sound generator 1200 in each of the first area and the second area. For example, the partition 700 may surround the first sound generator 1200 in each of the first area and the second area.

The partition 700 may be an air gap or a space that generates sound when the display panel 100 vibrates. An air gap or a space for generating or transferring sound may be referred to as a partition. Alternatively, the air gap or the space may be referred to as an enclosure or a baffle. The partition 700 may be referred to as a foam pad, but embodiments are not limited to these terms.

Moreover, the partition 700 may separate a left sound and a right sound respectively generated by the first sound generator 1200 in the first area and the first sound generator 1200 in the second area. A vibration of the display panel 100, performed in a space or an air gap defined as the partition 700, may be attenuated or absorbed in a center of the display area DA. Thus, a sound in the left area may not be transferred to a space of the right area. Therefore, because the partition 700 is provided, the left sound and the right sound may be separated from each other, thereby enhancing a sound output characteristic and a stereo characteristic of a sound.

The first sound generator 1200 in each of the first area and the second area may output sound having a middle-low-pitched sound band. For example, a middle-pitched sound band may be about 200 Hz to 3 kHz, and a high-pitched sound band may be about 3 kHz or more. However, embodiments are not limited thereto.

The partition 700 may include a material having elasticity, which may be capable of being compressed to some extent. For example, the partition 700 may include polyurethane, polyolefin, and/or the like, but embodiments are not limited thereto. For example, the partition 700 may be a double-sided tape, a single-sided tape, an adhesive, a bond, and/or the like, but embodiments are not limited thereto.

Figure 17B:
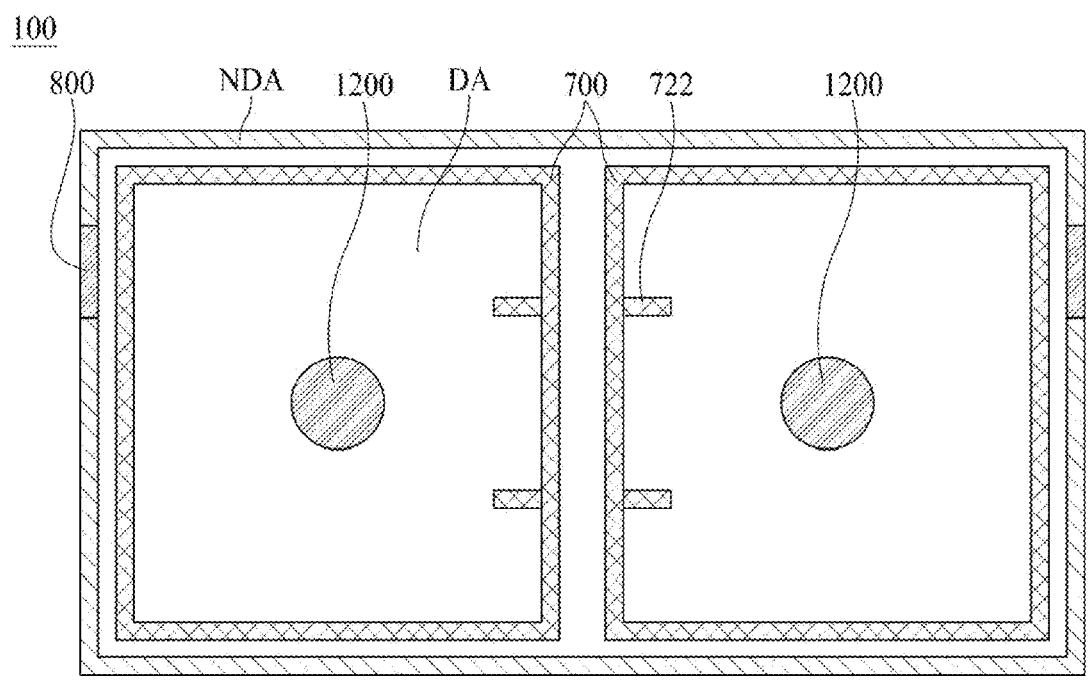

With reference to FIG. 17B, a protrusion portion 722 may be further provided on at least one side of a partition 700. For example, one or more protrusion portions 722 may be further provided on one or more sides of the partition 700. For example, a protrusion portion 722 in a left area of the display area DA may face or extend toward a first sound generator 1200 in the left area. A protrusion portion 722 in a right area of the display area DA may extend toward a first sound generator 1200 in the right area.

The protrusion portion 722 may trap a reflected wave, thereby decreasing the degree of reduction in a sound pressure level caused by a standing wave. The protrusion portion 722 may be provided as one or as a plurality on one or more sides of the partition 700. The one or more protrusion portions 722 may be symmetrically disposed with respect to the sound generator. As shown in the examples of FIG. 17B, the one or more protrusion portions 722 may be provided on one of second sides vertical to a first side of four sides of the display area DA. In FIG. 17B, the protrusion portions 722 are on the second side, but the protrusion portions 722 may be provided on a fourth side facing the second sides, without being limited thereto. The protrusion portions 722 may be on the second and fourth sides extending toward the first sound generator 1200. For example, the protrusion portions 722 may be on two sides with respect to the first sound generator 1200. The partition 700 and the protrusion portion 722 may each be a double-sided tape, a single-sided tape, an adhesive, a bond, and/or the like, but embodiments are not limited thereto.

Figure 17C:
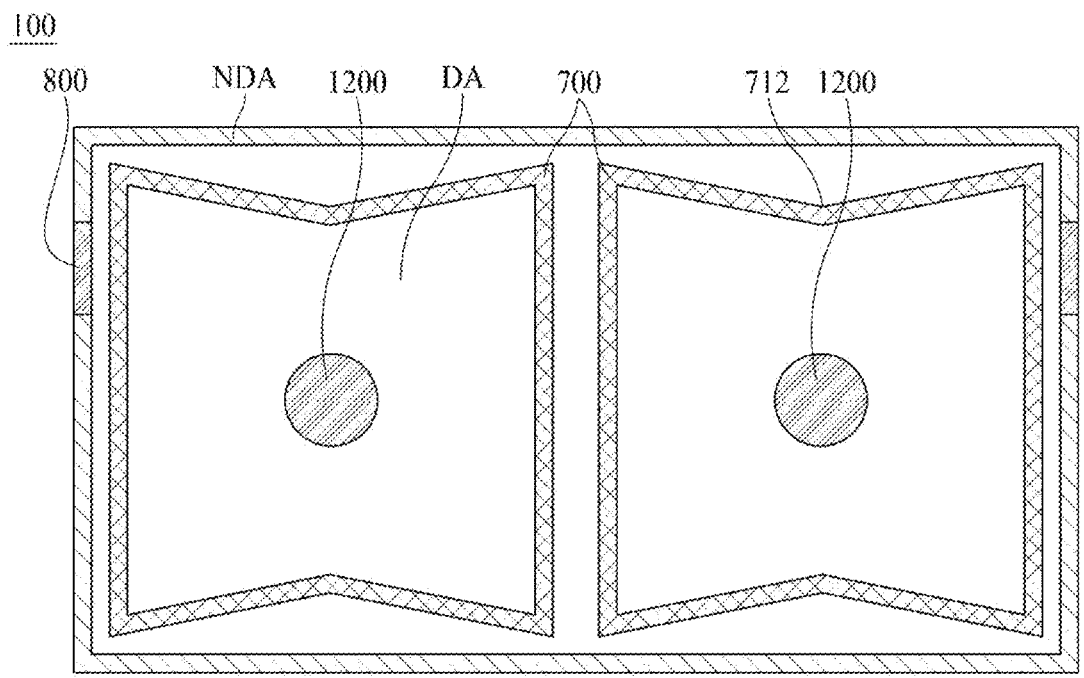

With reference to FIG. 17C, a bent part 712 may be further provided on one or more sides of a partition 700. The bent part 712 may be on one or more sides, which a strongest sound wave may reach, of the four sides of the partition 700, and may extend or bend toward a first sound generator 1200. The bent part 712 may extend or bend toward a center of the first sound generator 1200. Accordingly, the degree of reduction in a sound pressure level caused by the standing wave may be reduced.

A display area DA may include four sides, and the bent part 712 may be provided on one or more first sides of the four sides. Therefore, a bent part 712 may be provided on each of two sides (for example, an upper side and a lower side) of the four sides surrounding the display area DA to have a particular inclined angle with respect to a horizontal direction (or a widthwise or transverse direction) of the display panel. The bent part 712 may be configured with two rectilinear parts or two straight-line parts, and may be provided at a position at which the two rectilinear parts or two straight-line parts contact or meet each other. The bent part 712 may be provided in a rectilinear shape, a straight line shape, a curve shape, a round shape, or the like, but a shape of the bent part 712 is not limited thereto.

The inclined angle of the bent part 712 may be set based on a degree to which restriction of the standing wave is desired, and may be variably adjusted, e.g., to about 10° (degrees) to 30° (degrees). For example, if a sound output area is for the low-pitched sound band or an output of a sound generator is large, the inclined angle of the bent part 712 may be set to be a large angle. Alternatively, if the sound output area is for the high-pitched sound band or the output of the sound generator is small, the inclined angle of the bent part 712 may be set to be a small angle. For example, the inclined angle of the bent part 712 may be an angle at which one side of the partition 700 is inclined with respect to a horizontal direction (or a widthwise or length or transverse direction) of the display area DA. The horizontal direction (or the widthwise or length or transverse direction) may correspond to a direction of a long side of a display apparatus, and a vertical direction (or a lengthwise or longitudinal direction) may correspond to a direction of a short side of the display area DA. The partition 700 and the bent part 712 may each be a double-sided tape, a single-sided tape, an adhesive, a bond, and/or the like, but embodiments are not limited thereto.

Figure 17D:
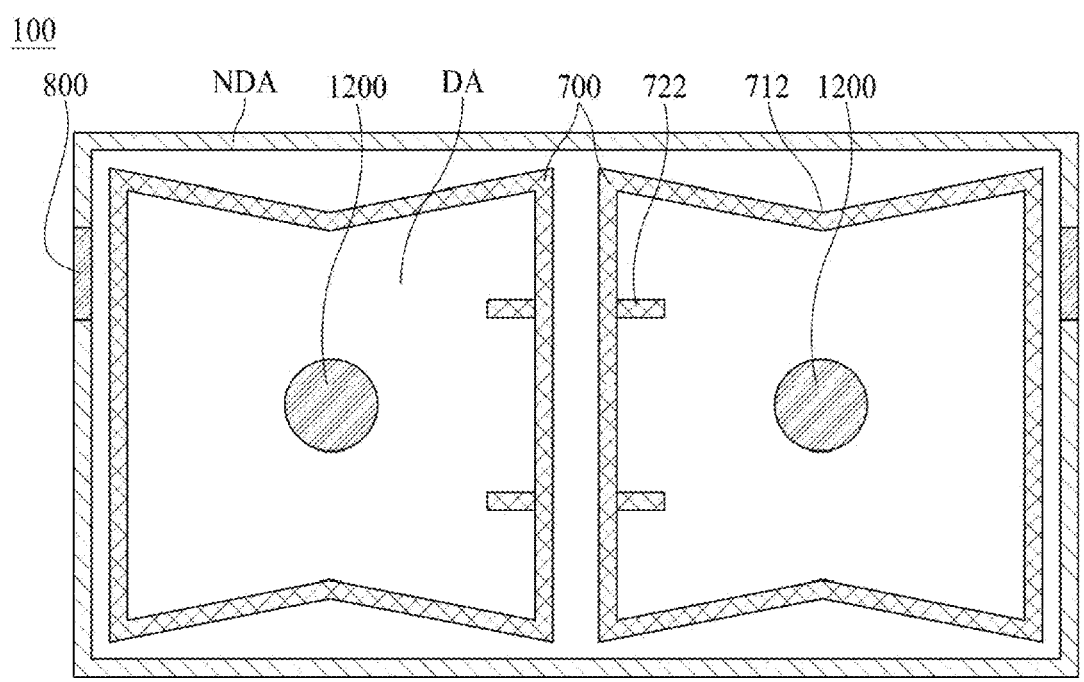

With reference to FIG. 17D, a bent part 712 and a protrusion portion 722 may be further provided on one or more sides of a partition 700. For example, one or more bent parts 712 may be on one or more sides of the partition 700, and one or more protrusion portions 722 may be on a side vertical to a side on which the bent part 712 is provided. A protrusion portion 722 in a left area of a display area DA may extend toward a first sound generator 1200 in the left area. A protrusion portion 722 in a right area of the display area DA may extend toward a first sound generator 1200 in the right area.

The protrusion 722 may trap a reflected wave, thereby decreasing the degree of reduction in a sound pressure level caused by a standing wave. The protrusion portion 722 may be provided as one or as a plurality on one or more sides of the partition 700, and the one or more protrusion portions 722 may be symmetrically disposed with respect to the sound generator. In FIG. 17D, the one or more protrusion portions 722 may be provided on one of second sides vertical to a first side of four sides of the display area DA. In FIG. 17D, the protrusion portions 722 may be provided on the second sides, but the protrusion portions 722 may be provided on a fourth side facing the second sides without being limited thereto. The protrusion portions 722 may be on the second and fourth sides extending toward the first sound generator 1200. For example, the protrusion portions 722 may be on two sides with respect to the first sound generator 1200. Moreover, the partition 700, the bent part 712, and the protrusion portion 722 may each be a double-sided tape, a single-sided tape, an adhesive, a bond, and/or the like, but embodiments are not limited thereto.

In FIGS. 17A to 17D, a partition, a bent part, and a protrusion portion in one sound generator in each of two areas have been described, and at least one of a partition, a bent part, and a protrusion portion may be similarly applied to the two sound generators and the pair of sound generators illustrated in FIGS. 15 and 16. Descriptions given above with reference to FIGS. 3B to 3F may be similarly applied to disposition of a second sound generator 800 in FIGS. 17A and 17D FIG. 18 is a cross-sectional view taken along line V-V' of FIG. 17A.

Figure 18:
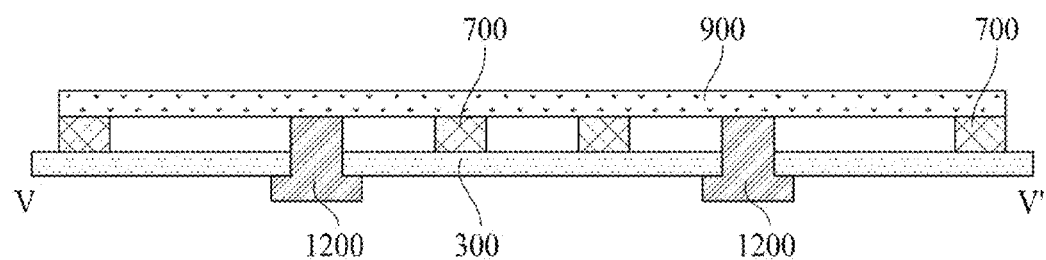
FIG. 18 is a cross-sectional view taken along line V-V' of FIG. 17A.

With reference to FIG. 18, a display apparatus according to an embodiment of the present disclosure may include a first sound generator 1200 in a left area and a second sound generator 1200 in a right area. For example, the first sound generator 1200 in the left area may be in a rear left area of an optical module 900. The first sound generator 1200 in the left area may be connected to the rear left area of the optical module 900, and may vibrate a left area of a display panel through the rear left area of the optical module 900.

The first sound generator 1200 in the right area may be in a rear right area of the optical module 900. The first sound generator 1200 in the right area may be connected to the rear right area of the optical module 900, and may vibrate the right area of the display panel through the rear right area of the optical module 900.

The first sound generators 1200, as illustrated in the examples of FIGS. 5 and 6, may each include a first sound generator 1200. Thus, duplicate descriptions are omitted.

The display apparatus according to an embodiment of the present disclosure may further include a partition 700. The partition 700 may divide a rear surface of the optical module 900 into a left area and a right area, thereby reducing or preventing interference from occurring between a sound generated in the left area and a sound generated in the right area. For example, the partition 700 may be on the rear surface of the optical module 900 between the first sound generator 1200 in the left area and the first sound generator 1200 in the right area, and may divide the left area and the right area. The partition 700 may be a connection member, and the partition 700 may surround an outer portion of each of the left area and the right area of the rear surface of the optical module 900. The partition 700 may surround an outer portion of each of the first sound generator 1200 in the left area and the first sound generator 1200 in the right area. Therefore, the left area and the right area of the rear surface of the optical module 900 may be divided by a connection member and the partition 700.

The partition 700 may be between the optical module 900 and a rear cover 301, which may be a supporting member. For example, the partition 700 may include a foam pad, a single-sided tape, a double-sided tape, an adhesive, and/or a bond, and may be attached to a front surface of the rear cover 301. Alternatively, the partition 700 may contact a rear surface of the optical module 900, or may be adjacent to the rear surface of the optical module 900 in a non-contact type.

The partition 700 may separate a sound generated by the first sound generator in the left area and a sound generated by the first sound generator in the right area to allow a 2.0 channel sound to be output from the display panel, based on a vibration of the display panel. Therefore, the display apparatus according to an embodiment of the present disclosure may output the 2.0 channel sound to a region in front of the display panel instead of a region behind and a region under the display panel by using the display panel, vibrating through the optical module 900, as a vibration plate of a sound generator, thereby transferring an accurate sound, improving sound quality, and enhancing a viewer's immersion experience. Also, due to a woofer output based on a vibration of a center area of the display panel and outputs of left and right stereo sounds from a left area and a right area of the display panel, the display apparatus according to an embodiment of the present disclosure may output the 2.0 channel sound to a region in front of the display panel instead of a region behind and a region under the display panel, thereby transferring an accurate sound, improving sound quality, and enhancing a viewer's immersion experience.

Figure 19:
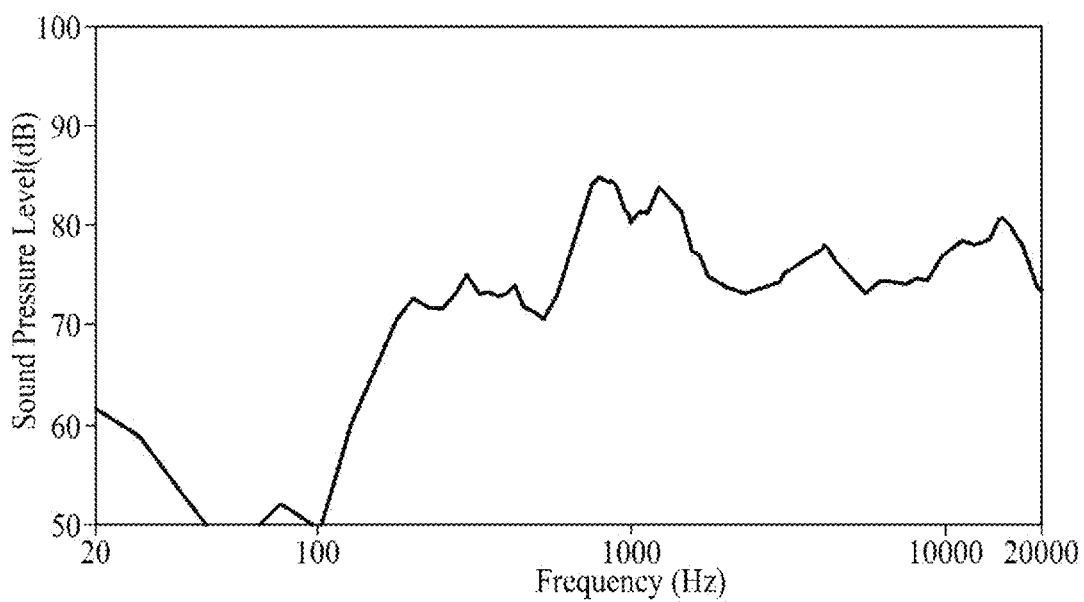
FIG. 19 is a diagram showing a sound output characteristic according to an embodiment of the present disclosure.

FIG. 19 is a diagram showing a sound output characteristic according to an embodiment of the present disclosure.

FIG. 19 is a diagram showing a sound output characteristic of a sound output unit including the first sound generator and the second sound generator illustrated in FIG. 3B. In FIG. 19, the abscissa axis (x-axis) represents a frequency in hertz (Hz), and the ordinate axis (y-axis) represents a sound pressure level in decibels (dB).

A sound output characteristic may be measured by a sound analysis apparatus. The sound analysis apparatus may include a sound card that transmits or receives a sound to or from a control personal computer (PC), an amplifier that amplifies a signal generated from the sound card and transfers the amplified signal to the sound generator 1200, and a microphone that collects a sound generated by the sound generator 1200 in a display panel. The sound collected through the microphone may be input to the control PC through the sound card, and a control program may check the input sound to analyze the sound of the sound generation device.

With reference to FIG. 19, in comparison with a case in which only the first sound generator described above with reference to FIG. 2 is provided, it can be seen that a sound pressure level increases in a frequency domain of 3 kHz or more, which is a frequency domain of the high-pitched sound band. Therefore, when the first sound generator and the second sound generator are provided, the first sound generator may generate sound having the middle-low-pitched sound band, and the second sound generator may generate sound having the high-pitched sound band. When the second sound generator, which may be a piezoelectric-type sound generator, is provided, sound quality corresponding to a frequency domain of the high-pitched sound band may be improved. The second sound generator for complementing high-pitched sound generation by the first sound generator may be provided, thereby providing a display apparatus for generating sound having uniform sound quality in a frequency domain of the low-pitched sound band to the high-pitched sound band. When the second sound generator is provided in the non-display area, a distance between the second sound generators disposed in the non-display area may increase, thereby enhancing a stereo effect of a sound.

Figure 20:
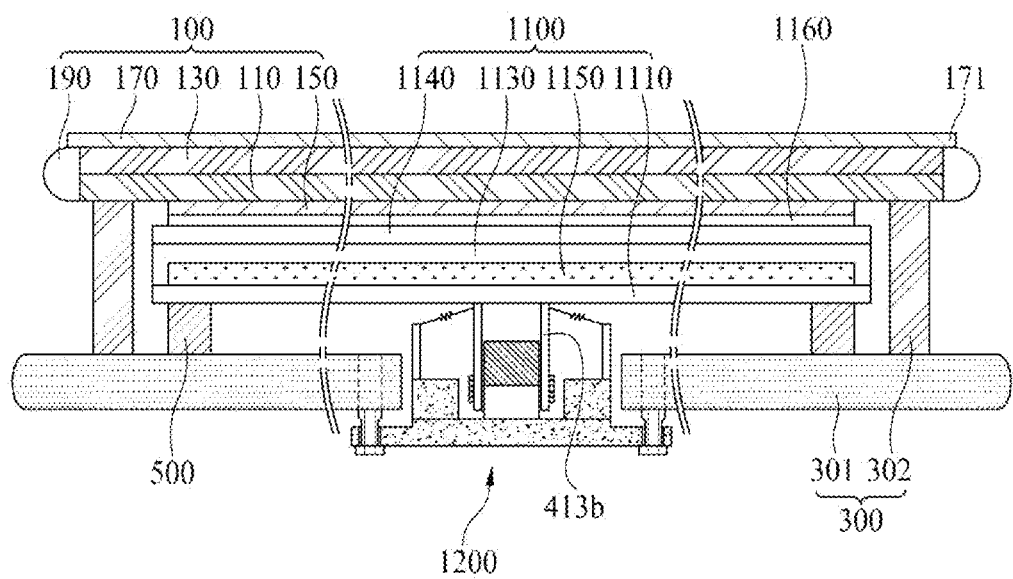
FIG. 20 is a diagram illustrating a display apparatus according to another embodiment of the present disclosure.

FIG. 20 is a diagram illustrating a display apparatus according to another embodiment of the present disclosure.

FIG. 20 is a cross-sectional view of a display apparatus according to another embodiment of the present disclosure, and illustrates an example in which a configuration of the optical module in the display apparatus illustrated in the FIG. 13 example has been modified. Therefore, only an optical module and elements relevant thereto will be described, and dupliacte descriptions of the other elements are omitted or will be briefly given.

With reference to FIG. 20, an optical module of the display apparatus according to another embodiment of the present disclosure may include a surface light source panel 1100. The surface light source panel 1100 may be on a rear surface of a display panel 100, and may be connected to a bobbin 413b included in a first sound generator 1200. The surface light source panel 1100 may be the optical module 900 of the aforementioned embodiments. The surface light source panel 1100 may be driven by a lighting driving circuit unit to irradiate light onto the rear surface of the display panel 100, and may transfer, to the display panel 100, a vibration based on the ascent or descent of the bobbin 413b included in the first sound generator 1200. Therefore, the display panel 100 may display an image by using the light irradiated from the surface light source panel 1100, and may vibrate based on a vibration of the first sound generator 1200 transferred through the surface light source panel 1100 to output sound in a forward direction.

The surface light source panel 1100 may include a base substrate 1110, a self-emitting device layer 1150, a passivation layer 1130, and a cover substrate 1140. The base substrate 1110 may include a light-transmitting plastic material or a glass material. The base substrate 1110 may be connected to the bobbin 413b included in the first sound generator 1200, and may vibrate based on the ascent and descent of the bobbin 413b. The base substrate 1110 may be connected to a rear cover 301 of a supporting member 300 by the above-described connection member 500.

The self-emitting device layer 1150 may include a driving circuit layer provided on the base substrate 1110, and a self-emitting device connected to the driving circuit layer. The driving circuit layer may include a driving circuit for allowing the self-emitting device to emit light, based on a passive matrix driving manner or an active matrix driving manner. Also, the driving circuit layer based on the active matrix driving manner may allow the self-emitting device to emit the light, based on light source data supplied according to a global dimming manner or a local dimming manner. The self-emitting device may emit the light with a current supplied from the driving circuit layer.

The self-emitting device may include a self-emitting layer that emits light with the current supplied from the driving circuit layer. The self-emitting device may include an organic light-emitting layer or a quantum dot light-emitting layer. According to another embodiment, the self-emitting device may include a micro light-emitting diode that emits light with the current supplied from the driving circuit layer. The passivation layer 1130 may be provided on the base substrate 1110 to cover the self-emitting device layer 1150, thereby protecting the self-emitting device layer 1150.

The cover substrate 1140 may be attached to the passivation layer 1130 to protect the passivation layer 1130 and the self-emitting device layer 1150 from an external impact. The cover substrate 1140 may include a light-transmitting plastic material or a glass material.

The surface light source panel 1100 may be connected to a rear surface of the display panel 100 by an adhesive member 1160. The adhesive member 1160 may be between the display panel 100 and the cover substrate 1140 of the surface light source panel 1100, and may connect the surface light source panel 1100 to a whole rear surface of a second polarization member 150 included in the display panel 100.

The adhesive member 1160 may be attached to a whole front surface of the surface light source panel 1100 so that an air gap is not formed between the display panel 100 and the surface light source panel 1100. For example, a vibration of the surface light source panel 1100 caused by the first sound generator 1200 may be transferred to the display panel 100 through the adhesive member 1160. If an air gap is between the surface light source panel 1100 and the display panel 100, a vibration transferred to the display panel 100 may be reduced due to the air gap. Accordingly, the adhesive member 1160 may be between the surface light source panel 1100 and the display panel 100 without an air gap, so that the vibration of the surface light source panel 1100 may be transferred to the display panel 100 without being reduced.

The adhesive member 1160 may be an optical adhesive, an optical adhesive film, and/or the like, but embodiments are not limited thereto. For example, the adhesive member 1160 may be an optically clear adhesive (OCA), an optically clear resin (OCR), and/or the like. For example, the adhesive member 1160 may be one of: a double-sided tape, a single-sided tape, an adhesive, and/or a bond. The surface light source panel 1100 may be attached to the display panel 100 without the adhesive member 1160.

The display apparatus according to an embodiment of the present disclosure may output sound to a region in front of the display panel 100 instead of a region behind and a region under the display panel 100 by using the display panel 100, vibrating through an optical module including the surface light source panel 1100, as a vibration plate of a sound generator, thereby transferring an accurate sound, improving sound quality, enhancing a viewer's immersion experience, and slimming the display apparatus.

In FIG. 20, one first sound generator is illustrated for example, but, as illustrated in FIG. 3B, two first sound generators may be provided. Also, as in FIGS. 15 and 16, two sound generators and/or a pair of sound generators may be provided.

The display panel including a sound generator according to an embodiment of the present disclosure may use all types of display panels, such as a liquid crystal display panel, an organic light-emitting diode (OLED) display panel, and an electroluminescent display panel, but is not limited to a specific type of display panel vibrated by the sound generator according to the present disclosure to generate sound. The sound generator according to an embodiment of the present disclosure may be applied to a display panel including an organic light-emitting layer, a quantum dot light-emitting layer, and a micro light-emitting diode.

The sound generator according to an embodiment of the present disclosure may be applied as a sound generator provided in a display apparatus. The display apparatus according to an embodiment of the present disclosure may be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, televisions (TVs), notebook computers, monitors, cameras, camcorders, home appliances, etc.

A display apparatus according to an example embodiment of the present disclosure will be described below.

According to an embodiment of the present disclosure, a display apparatus may include: a display panel including: a display area configured to display an image, and a non-display area, at least one first sound generator in the display area, and at least one second sound generator in the non-display area. Each of the at least one first sound generator and the at least one second sound generator may be configured to vibrate the display panel to generate sound toward a front of the display panel.

For example, the display apparatus according to an embodiment of the present disclosure may further include an optical module on a rear surface of the display panel, and the at least one first sound generator may be on a rear surface of the optical module. For example, the display apparatus according to an embodiment of the present disclosure may further include a supporting member on the rear surface of the display panel, and the supporting member may include a supporting hole configured to accommodate the at least one first sound generator.

For example, the display apparatus according to an embodiment of the present disclosure may further include a module frame fixed to the supporting member, a portion of the module frame being accommodated into the supporting hole of the supporting member, and the at least one first sound generator may be in the module frame and may be configured to vibrate the optical module. For example, the display apparatus according to an embodiment of the present disclosure may further include a fixing member configured to fix the at least one first sound generator to a rear surface of the supporting member.

For example, in the display apparatus according to an embodiment of the present disclosure, the fixing member may include: a fixing frame attached to the rear surface of the supporting member, and a fastening unit configured to fix the at least one first sound generator to the fixing frame. For example, in the display apparatus according to an embodiment of the present disclosure, the fixing member may include one or more of: a double-sided tape, a single-sided tape, an adhesive, and a bond. For example, the display apparatus according to an embodiment of the present disclosure may further include a nut fixed to the supporting member, and the at least one first sound generator may be fixed to the nut by a screw.

For example, the display apparatus according to an embodiment of the present disclosure may further include an optical module on a rear surface of the display panel, the optical module including: a light guide member including a light incident surface, and an optical sheet part on a front surface of the light guide member and connected to the rear surface of the display panel. For example, in the display apparatus according to an embodiment of the present disclosure, the light guide member may be configured to be vibrated by the at least one first sound generator, and the display panel may be configured to receive the vibration of the light guide member to vibrate.

For example, in the display apparatus according to an embodiment of the present disclosure, the optical module may be attached to the supporting member by a connection member. For example, in the display apparatus according to an embodiment of the present disclosure, the at least one first sound generator may include a coil-type sound generator, and the at least one second sound generator may include a piezoelectric-type sound generator.

For example, in the display apparatus according to an embodiment of the present disclosure, the at least one first sound generator may include: a magnet and a center pole on a plate, a bobbin near the center pole, and a coil near the bobbin. For example, in the display apparatus according to an embodiment of the present disclosure, the display area may include a first area and a second area, and the at least one first sound generator may be in each of the first area and the second area.

For example, the display apparatus according to an embodiment of the present disclosure may further include a partition near the at least one first sound generator in each of the first area and the second area. For example, the display apparatus according to an embodiment of the present disclosure may further include a partition near the at least one first sound generator in each of the first area and the second area, and a bent part on at least one first side of four sides of the partition, the bent part being bent in a direction toward the at least one first sound generator.

For example, the display apparatus according to an embodiment of the present disclosure may further include a partition near the at least one first sound generator in each of the first area and the second area, a bent part on at least one first side of four sides of the partition, the bent part being bent in a direction toward the at least one first sound generator, and at least one protrusion portion on at least one second side vertical to the at least first side. For example, in the display apparatus according to an embodiment of the present disclosure, the at least one second sound generator may be attached to the display panel by an adhesive member.

According to an embodiment of the present disclosure, a display apparatus may include: a display panel including: a display area configured to display an image, and a non-display area, an optical module on a rear surface of the display panel, at least one coil-type sound generator on a rear surface of the optical module, and at least one piezoelectric-type sound generator in the non-display area.

For example, in the display apparatus according to an embodiment of the present disclosure, the non-display area may include peripheries of four sides of the display area, and the at least one piezoelectric-type sound generator may be in a periphery of at least one side of the four sides. For example, in the display apparatus according to an embodiment of the present disclosure, the optical module may be configured to be vibrated by the at least one coil-type sound generator, and the display panel may be configured to receive the vibration of the optical module to vibrate.

For example, in the display apparatus according to an embodiment of the present disclosure, the at least one coil-type sound generator may be configured to generate sound having a middle-low-pitched sound band, and the at least one piezoelectric-type sound generator may be configured to generate sound having a high-pitched sound band. For example, in the display apparatus according to an embodiment of the present disclosure, the display panel may include: a first substrate and a second substrate, a first polarization member on the first substrate, and a second polarization member on the second substrate.

For example, in the display apparatus according to an embodiment of the present disclosure, the at least one piezoelectric-type sound generator may be attached to the first substrate or the second substrate by an adhesive member. For example, in the display apparatus according to an embodiment of the present disclosure, the at least one piezoelectric-type sound generator may be attached to the first polarization member or the second polarization member by an adhesive member.

For example, the display apparatus according to an embodiment of the present disclosure may further include a supporting member on the rear surface of the display panel, and the at least one coil-type sound generator may be between the supporting member and the optical module. For example, in the display apparatus according to an embodiment of the present disclosure, the at least one coil-type sound generator may include one sound generator, a sound generator including two or more sound generators, or a pair of sound generators.

For example, in the display apparatus according to an embodiment of the present disclosure, the at least one coil-type sound generator may include: a magnet and a center pole on a plate, a bobbin near the center pole, and a coil near the bobbin. For example, in the display apparatus according to an embodiment of the present disclosure, the optical module may include a surface light source panel connected to: the rear surface of the display panel, and the at least one coil-type sound generator, the surface light source panel may be configured to be vibrated by the at least one coil-type sound generator, and the display panel may be configured to receive the vibration of the surface light source panel to vibrate. For example, in the display apparatus according to an embodiment of the present disclosure, the surface light source panel may include a self-emitting device layer including one of an organic light emitting layer, a quantum dot light emitting layer, and a micro light emitting diode.

As described above, according to the embodiments of the present disclosure, the sound generator which vibrates the display panel to allow a sound to be output in a forward direction of the display panel may be provided, thereby providing a display apparatus for enhancing sound quality and a viewer's immersion experience.

Moreover, according to the embodiments of the present disclosure, because the second sound generator which may be a piezoelectric-type sound generator is further provided, the quality of a sound having a frequency domain of the high-pitched sound band is improved, thereby providing a display apparatus with enhanced sound output characteristic.

Moreover, according to the embodiments of the present disclosure, the piezoelectric-type sound generator for complementing high-pitched sound generation by the coil-type sound generator may be further provided, thereby providing a display apparatus for generating sound having uniform sound quality in a frequency domain of the low-pitched sound band to the high-pitched sound band.

Moreover, according to the embodiments of the present disclosure, the coil-type sound generator may be provided in the display area, and the piezoelectric-type sound generator may be provided in the non-display area. Accordingly, the bezel area does not increase despite the sound generator, thereby providing a display apparatus with enhanced sound output characteristic.

Moreover, in the display apparatus according to the embodiments of the present disclosure, the piezoelectric-type sound generator may generate sound by using the non-display area or the bezel area as a vibration plate. Accordingly, a degree of freedom in disposition of the piezoelectric-type sound generator may be enhanced regardless of a position at which the piezoelectric-type sound generator may be disposed in the non-display area.

Moreover, in the display apparatus according to the embodiments of the present disclosure, because the piezoelectric-type sound generator is not disposed in the display area where the optical module and the like are disposed, a sound path may not be blocked by the optical module and the like. Thus, sound quality may be enhanced.

Moreover, in the display apparatus according to the embodiments of the present disclosure, a thickness of the piezoelectric-type sound generator is thin. Thus, a small speaker may be provided in the display apparatus.

Moreover, in the display apparatus according to the embodiments of the present disclosure, because the piezoelectric-type sound generators are disposed in the non-display area, a distance between the piezoelectric-type sound generators disposed in the non-display area increases, thereby enhancing a stereo effect of a sound.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An apparatus, comprising:
a vibration plate comprising:
an area; and
a bezel area surrounding the area;
at least one first sound generator at the area; and
at least one second sound generator at the bezel area,
wherein each of the at least one first sound generator and the at least one second sound generator is configured to vibrate the vibration plate to generate sound.

2. The apparatus of claim 1, wherein the at least one first sound generator is spaced apart from the at least one second sound generator.

3. The apparatus of claim 1, wherein:
the vibration plate comprises a display panel; and
the area comprises a display area of the display panel.

4. The apparatus of claim 1, further comprising:
an optical module on a rear surface of the vibration plate,
wherein the at least one first sound generator is on a rear surface of the optical module, and
wherein the at least one first sound generator is configured to vibrate the optical module.

5. The apparatus of claim 4, wherein the vibration plate is configured to receive the vibration of the optical module to vibrate.

6. The apparatus of claim 4, further comprising:
a supporting member on the rear surface of the vibration plate,
wherein the at least one first sound generator is between the supporting member and the optical module, and wherein the at least one first sound generator is configured to vibrate the optical module.

7. The apparatus of claim 6, further comprising a first connection member between the optical module and a rear surface of the supporting member.

8. The apparatus of claim 4, wherein the optical module comprises a light guide member.

9. The apparatus of claim 8, wherein:
the light guide member is configured to be vibrated by the at least one first sound generator; and
the vibration plate is configured to receive the vibration of the light guide member to vibrate.

10. The apparatus of claim 8, wherein the optical module further comprises an optical sheet part between the light guide member and the rear surface of the vibration plate.

11. The apparatus of claim 1, wherein:
the at least one first sound generator comprises a coil-type sound generator; and
the at least one second sound generator comprises a piezoelectric-type sound generator.

12. The apparatus of claim 1, wherein the at least one first sound generator comprises:
a magnet and a center pole on a plate;
a bobbin near the center pole; and
a coil near the bobbin.

13. The apparatus of claim 1, further comprising:
a supporting member on a rear surface of the vibration plate, the supporting member comprising a hole,
wherein the at least one first sound generator is accommodated into the hole.

14. The apparatus of claim 1, further comprising:
a supporting member on a rear surface of the vibration plate; and
a module securing member configured to fix the at least one first sound generator to a rear surface of the supporting member.

15. The apparatus of claim 1, further comprising:
a supporting member on a rear surface of the vibration plate; and
an adhesive member between the supporting member and the at least one first sound generator.

16. The apparatus of claim 12, further comprising:
a supporting member on a rear surface of the vibration plate;
an extension part of the plate; and
a connection member in the extension part,
wherein the at least one first sound generator is configured to connect to the supporting member by the connection member.

17. The apparatus of claim 1, wherein:
the area comprises a first area and a second area; and
the at least one first sound generator is disposed at each of the first area and the second area.

18. The apparatus of claim 17, further comprising a partition surrounding the at least one first sound generator in each of the first area and the second area.

19. The apparatus of claim 17, further comprising:
a partition surrounding the at least one first sound generator in each of the first area and the second area; and
a bent part on one or more of side of four sides of the partition, the bent part being bent toward the at least one first sound generator.

20. The apparatus of claim 17, further comprising:
a partition surrounding the at least one first sound generator in each of the first area and the second area;
a bent part on at least a first side among four sides of the partition, the bent part being bent toward the at least one first sound generator; and
at least one protrusion portion on at least one second side vertical to the at least first side.

21. The apparatus of claim 1, wherein the at least one second sound generator is attached to the vibration plate by an adhesive member.

22. The apparatus of claim 1, wherein:
the at least one first sound generator does not overlap the bezel area; and
the at least one first sound generator is configured to vibrate the area of the vibration plate to generate sound.

23. The apparatus of claim 1, wherein the at least one first sound generator and the at least one second sound generator are asymmetrically disposed.

24. An apparatus, comprising:
a vibration plate comprising:
an area; and
a bezel area surrounding the area;
at least one vibration generator overlapping the area; and
at least one exciter overlapping the bezel area,
wherein each of the at least one vibration generator and the at least one exciter is configured to vibrate the vibration plate.

25. The apparatus of claim 24, wherein:
the bezel area comprises peripheries of four sides of the vibration plate; and
the at least one exciter is in a periphery of at least one or more side of the four sides.

26. The apparatus of claim 24, wherein the at least one vibration generator and the at least one exciter are asymmetrically disposed.

27. The apparatus of claim 24, wherein:
the at least one vibration generator is configured to vibrate the area of the vibration plate to generate sound having a middle-low-pitched sound band; and
the at least one exciter is configured to vibrate the bezel area of the vibration plate to generate sound having a high-pitched sound band.

28. The apparatus of claim 24, wherein:
the at least one vibration generator is configured to vibrate the area as a vibration plate; and
the at least one exciter is configured to vibrate the bezel area as a vibration plate.

29. The apparatus of claim 24, wherein the vibration plate comprises:
a first substrate;
a second substrate;
a first polarization member on the first substrate; and
a second polarization member on the second substrate.

30. The apparatus of claim 29, wherein the at least one exciter is attached to the first substrate or the second substrate by an adhesive member.

31. The apparatus of claim 29, wherein the at least one exciter and the first polarization member or the second polarization member have a distance.

32. The apparatus of claim 29, wherein the at least one exciter is attached to the first polarization member or the second polarization member by an adhesive member.

33. The apparatus of claim 24, wherein the at least one vibration generator comprises:
a magnet and a center pole on a plate;
a bobbin near the center pole; and
a coil near the bobbin.

34. The apparatus of claim 24, further comprising:
an optical module on a rear surface of the vibration plate, wherein the optical module comprises a surface light source panel connected to the rear surface of the vibration plate and to the at least one vibration generator, wherein the surface light source panel is configured to be vibrated by the at least one vibration generator, and wherein the vibration plate is configured to receive the vibration of the surface light source panel to vibrate.

35. The apparatus of claim 34, further comprising:

a supporting member on the rear surface of the vibration plate, wherein the at least vibration generator is between the supporting member and the optical module.

36. The apparatus of claim 34, wherein the surface light source panel comprises a self-emitting device layer comprising one or more of: an organic light emitting layer, a quantum dot light emitting layer, and a micro light emitting diode.

37. The apparatus of claim 24, wherein:

the at least one vibration generator does not overlap the bezel area; and the at least one vibration generator is configured to vibrate the area of the vibration plate to generate sound.

\* \* \* \* \*